US011024698B2

(12) United States Patent
Tamura

(10) Patent No.: US 11,024,698 B2
(45) Date of Patent: Jun. 1, 2021

(54) DISPLAY DEVICE INCLUDING DRIVING CIRCUIT WITH FIRST AND SECOND CAPACITORS

(71) Applicant: Sony Corporation, Tokyo (JP)

(72) Inventor: Kazuhiro Tamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/803,013

(22) Filed: Feb. 27, 2020

(65) Prior Publication Data
US 2020/0203464 A1 Jun. 25, 2020

Related U.S. Application Data

(63) Continuation of application No. 16/092,472, filed as application No. PCT/JP2017/020996 on Jun. 6, 2017, now Pat. No. 10,622,435.

(30) Foreign Application Priority Data

Jul. 29, 2016 (JP) .............................. JP2016-149164

(51) Int. Cl.
*G09G 3/3233* (2016.01)
*H01L 27/32* (2006.01)
(Continued)

(52) U.S. Cl.
CPC ............ *H01L 27/3276* (2013.01); *G09F 9/30* (2013.01); *G09G 3/20* (2013.01); *G09G 3/3233* (2013.01); *H01L 27/124* (2013.01); *H01L 27/3258* (2013.01); *H01L 27/3265* (2013.01); *H01L 51/50* (2013.01); *H01L 51/5206* (2013.01);
(Continued)

(58) Field of Classification Search
CPC ............... H01L 27/3276; H01L 27/124; H01L 27/3258; H01L 27/3265; H01L 51/5206; H01L 51/5221; H01L 51/50; H01L 2227/323; G09G 3/3233; G09G 3/20;
(Continued)

(56) References Cited

U.S. PATENT DOCUMENTS

2005/0156829 A1* 7/2005 Choi ..................... G09G 3/3233
345/76
2010/0079419 A1* 4/2010 Shibusawa .......... H01L 27/3272
345/204
(Continued)

FOREIGN PATENT DOCUMENTS

JP 05-034709 A 2/1993
JP 07-146491 A 6/1995
(Continued)

*Primary Examiner* — Rodney Amadiz
(74) *Attorney, Agent, or Firm* — Michael Best & Friedrich LLP

(57) ABSTRACT

A display device of the present disclosure includes: a circuit unit including a semiconductor substrate and a capacitative element, in which the capacitative element includes, a dielectric layer which is formed in the semiconductor substrate, and extends in a substrate depth direction, a first electrode formed on one surface side of the dielectric layer to face the dielectric layer, and a second electrode formed on the other surface side of the dielectric layer to face the dielectric layer. An electronic device of the present disclosure includes the display device having the configuration described above.

12 Claims, 16 Drawing Sheets

(51) Int. Cl.
*H01L 51/50* (2006.01)
*G09F 9/30* (2006.01)
*G09G 3/20* (2006.01)
*H01L 27/12* (2006.01)
*H01L 51/52* (2006.01)
*G02B 27/01* (2006.01)
*H04N 5/232* (2006.01)

(52) U.S. Cl.
CPC ........ *H01L 51/5221* (2013.01); *G02B 27/017* (2013.01); *G09G 2300/0439* (2013.01); *H01L 2227/323* (2013.01); *H04N 5/23293* (2013.01)

(58) Field of Classification Search
CPC ............. G09G 2300/0439; G09F 9/30; G02B 27/017; H04N 5/23293
See application file for complete search history.

(56) References Cited

U.S. PATENT DOCUMENTS

| | | |
|---|---|---|
| 2010/0283054 A1 | 11/2010 | Hirano et al. |
| 2012/0175649 A1 | 7/2012 | Hong |
| 2014/0347347 A1* | 11/2014 | Jeong ................ G09G 5/18 345/213 |
| 2014/0375705 A1* | 12/2014 | Nathan ............ G09G 3/3233 345/694 |
| 2015/0371590 A1* | 12/2015 | Jeong ............ G09G 3/3233 345/213 |
| 2018/0181242 A1* | 6/2018 | Mizuhashi ........ G06F 3/0446 |

FOREIGN PATENT DOCUMENTS

| | | |
|---|---|---|
| JP | 2000-137246 A | 5/2000 |
| JP | 2012-173470 A | 9/2012 |
| JP | 2014-098779 A | 5/2014 |
| JP | 2015-034861 A | 2/2015 |
| WO | 2007/060881 A1 | 5/2007 |

* cited by examiner (STEP 1)

(STEP 2)

(STEP 3)

(STEP 4)

(STEP 5)

(STEP 6)

(STEP 7)

(STEP 1)

(STEP 2)

(STEP 3)

(STEP 4)

(STEP 5)

(STEP 6)

(STEP 7)

(STEP 8)

(STEP 1)

(STEP 2)

(STEP 3)

(STEP 4)

(STEP 5)

(STEP 6)

(STEP 7)

(STEP 8)

DISPLAY DEVICE INCLUDING DRIVING CIRCUIT WITH FIRST AND SECOND CAPACITORS

CROSS-REFERENCE TO RELATED APPLICATIONS

The present application is a Continuation of U.S. application Ser. No. 16/092,472, filed Oct. 10, 2018, which was a 371 application of International Patent Application No. PCT/JP2017/020996, filed on Jun. 6, 2017, which claims priority to Japanese Patent Application No. 2016-149164, filed in the Japan Patent Office on Jul. 29, 2016, the entire contents of which are each incorporated by reference herein.

TECHNICAL FIELD

The present disclosure relates to a display device, manufacturing method of a display device, and an electronic device.

BACKGROUND ART

There is an organic electroluminescence display device (hereinafter, referred to as an "organic EL display device") using an organic electroluminescence element (hereinafter, referred to as an "organic EL element"), which is a self-light emitting element, as one of display devices. The organic EL display device is a self-light emitting type organic EL display device, and thus, has characteristics of low power consumption, and has developed and has been commercialized for practical use.

In the organic EL display device, a circuit unit having a 4Tr/2C circuit configuration, including four transistors (Tr), and two capacitative elements (C) connected to the transistors, is used as a driving circuit unit driving a light emitting unit (the organic EL element) (for example, refer to Patent Document 1). In the driving circuit unit, a threshold value correction operation for correcting a characteristic variation in each pixel, a bootstrap operation for correcting a brightness, or the like is performed. In order to stabilize such characteristics, a circuit configuration using a capacitative element is important.

CITATION LIST

Patent Document

Patent Document 1: Japanese Patent Application Laid-Open No. 2015-34861

SUMMARY OF THE INVENTION

Problems to be Solved by the Invention

In a display device such as an organic EL display device, in general, a capacitative element having a structure formed by using a wiring layer, is used as the capacitative element. In the driving circuit unit driving the light emitting unit of the pixel, within a limited region of each of the pixels, a capacitative element of a structure having a necessary capacitance value, is formed. For this reason, refining a pixel size (definition enhancement of a display image) and ensuring the capacitance value of the capacitative element are in a trade-off relationship. Specifically, in a case of ensuring a large capacitance value of the capacitative element, a forming region of the capacitative element increases. Then, the pixel size increases as the forming region of the capacitative element increases, and thus, the definition enhancement is inhibited.

Furthermore, here, the driving circuit unit has been described as an example, but even in a peripheral circuit unit arranged in the vicinity of a pixel array portion, an increase in the forming region of the capacitative element causes an increase in a forming region of the peripheral circuit unit, and thus, a decrease in the size of the display device is inhibited.

Therefore, an object of the present disclosure is to provide a display device capable of contributing to a reduction in a forming region of a circuit unit such as a driving circuit unit or a peripheral circuit unit, a manufacturing method of the display device, and an electronic device including the display device.

Solutions to Problems

A display device of the present disclosure to achieve the above-described object includes:

a circuit unit including a semiconductor substrate and a capacitative element, in which the capacitative element includes, a dielectric layer which is formed in the semiconductor substrate, and extends in a substrate depth direction, a first electrode formed on one surface side of the dielectric layer to face the dielectric layer, and a second electrode formed on the other surface side of the dielectric layer to face the dielectric layer. In addition, an electronic device of the present disclosure for attaining the object described above, includes: the display device having the configuration described above.

A manufacturing method of a display device of the present disclosure to achieve the above-described object is a manufacturing method of a display device provided with a circuit unit including a semiconductor substrate and a capacitative element, in which the capacitative element is manufactured by executing processing of each step of:

forming a dielectric layer extending in a substrate depth direction, in the semiconductor substrate;

forming a first electrode on one surface side of the dielectric layer to face the dielectric layer; and then forming a second electrode on the other surface side of the dielectric layer to face the dielectric layer.

Effects of the Invention

According to the present disclosure, a capacitative element is built in a semiconductor substrate, and thus, it is not necessary to ensure a region for forming the capacitative element on the semiconductor substrate, and therefore, it is possible to contribute to a reduction in a forming region of a circuit unit such as a driving circuit unit or a peripheral circuit unit.

Furthermore, the effect of the present disclosure is not necessarily limited to the effects described here, but may be anyone of the effects described herein. In addition, the effects described herein are merely an example, and the present disclosure is not limited thereto, and may have an additional effect.

MODE FOR CARRYING OUT THE INVENTION

Figure 1:
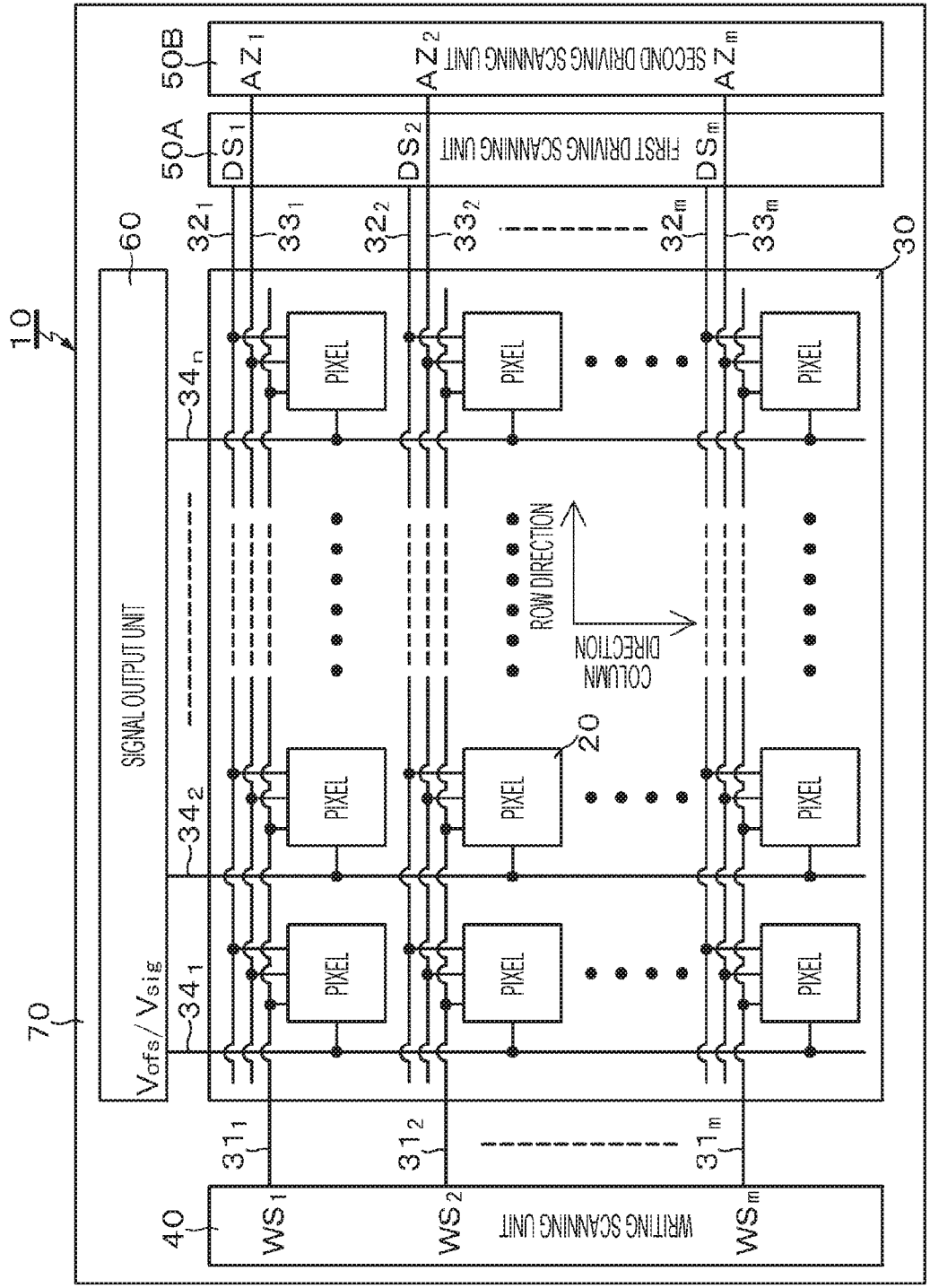
FIG. 1 is a system configuration diagram illustrating an outline of a configuration of an active matrix type organic EL display device of the present disclosure.

Hereinafter, modes for carrying out a technology of the present disclosure (hereinafter, referred to as an "embodiment") will be described in detail, by using the drawings. The technology of the present disclosure is not limited to the embodiment, and various materials or the like in the embodiment are an example. In the following description, the same reference numerals will be used in the same constituents or constituents having the same functions, and the repeated description thereof will be omitted. Furthermore, the description will be given in the following order.

1. General Description of Display Device, Manufacturing Method of Display Device, and Electronic Device, of Present Disclosure
2. Active Matrix Type Organic EL Display Device
2-1. System Configuration
2-2. Pixel Circuit
2-3. Basic Circuit Operation
2-4. Pixel Structure
2-5. Capacitative Element Built in Semiconductor Substrate
2-5-1. Example 1
2-5-2. Example 2 (Modification Example of Example 1)
2-5-3. Example 3 (Modification Example of Example 1)
2-5-4. Application Example
3. Modification Example
4. Electronic Device of Present Disclosure
4-1. Specific Example 1 (Example of Digital Still Camera)
4-2. Specific Example 2 (Example of Head-Mount Type Display)
5. Configuration Capable of being Taken by Present Disclosure <General Description of Display Device, Manufacturing Method of Display Device, and Electronic Device, of Present Disclosure>

In a display device, a manufacturing method of a display device, and an electronic device, of the present disclosure, a circuit unit can be configured as a driving circuit unit which is disposed in each pixel including a light emitting unit, and drives the light emitting unit. At this time, the driving circuit unit is capable of including a driving transistor driving the light emitting unit. Then, a dielectric layer and a first electrode can be formed in an element separation region separating the pixels from each other, in the semiconductor substrate, and the first electrode can be electrically connected to one source/drain region of the driving transistor.

In the display device, the manufacturing method of the display device, and the electronic device, of the present disclosure, having the preferred configurations described above, the dielectric layer and the first electrode can be formed such that lower end portions thereof are in a position deeper than a lower end of the element separation region, in a substrate depth direction. In addition, a second electrode can be formed on the one source/drain region side in the semiconductor substrate. Further, the second electrode can be electrically connected to a power line.

<Active Matrix Type Display Device>

A display device of the present disclosure is an active matrix type display device controlling an electrical current flowing through an electrooptical element, by an active element disposed in the same pixel circuit as that of the electrooptical element, for example, an insulating gate type electrical field effect transistor. A metal oxide semiconductor (MOS) transistor or a thin film transistor (TFT) can be typically exemplified as the insulating gate type electrical field effect transistor.

Here, for example, an active matrix type organic EL display device using an organic EL element, which is an electrical current driving type electrooptical element, in which a light emitting brightness is changed according to an electrical current value flowing through a device, as the light emitting unit (a light emitting element) of the pixel circuit, will be described as an example. Hereinafter, the "pixel circuit" will be also simply referred to as a "pixel".

[System Configuration]

FIG. 1 is a system configuration diagram illustrating the outline of the configuration of the active matrix type organic EL display device of the present disclosure. As illustrated in FIG. 1, an organic EL display device 10 of the present disclosure includes a pixel array portion 30 in which a plurality of pixels 20 including an organic EL element are two-dimensionally arranged into the shape of a matrix, and a peripheral circuit unit arranged in the vicinity of the pixel array portion 30. The peripheral circuit unit, for example, includes a writing scanning unit 40, a first driving scanning unit 50A, a second driving scanning unit 50B, a signal output unit 60, and the like, which are mounted on the same display panel 70 as that of the pixel array portion 30, and drives each of the pixels 20 of the pixel array portion 30. Furthermore, some or all of the writing scanning unit 40, the first driving scanning unit 50A, the second driving scanning unit 50B, and the signal output unit 60 can be disposed out of the display panel 70.

The organic EL display device 10 can be configured to perform monochrome (black and white) display, and to perform color display. In a case where the organic EL display device 10 performs the color display, one pixel (a unit pixel/a pixel), which is a unit forming a color image, includes a plurality of subpixels. At this time, each of the subpixels corresponds to the pixel 20 of FIG. 1. More specifically, in the display device performing the color display, one pixel, for example, includes three subpixels of a subpixel emitting red (R) light, a subpixel emitting green (G) light, and a subpixel emitting blue (B) light.

Here, one pixel is not limited to a combination of subpixels of three primary colors of RGB, and one pixel can be configured by further adding subpixels of one color or a plurality of colors to the subpixels of three primary colors. More specifically, for example, one pixel can be configured by adding a subpixel emitting white (W) light in order to improve a brightness, or one pixel can be configured by adding at least one subpixel emitting complementary color light in order to enlarge a color reproduction range.

In the pixel array portion 30, a scanning line 31 ($31_1$ to $31_m$), a first driving line 32 ($32_1$ to $32_m$), and a second driving line 33 ($33_1$ to $33_m$) are wired along a row direction (an arrangement direction of the pixels in a pixel row), for each pixel row, with respect to the arrangement of the pixels 20 in m rows and n columns. Further, a signal line 34 ($34_1$ to $34_n$) is wired along a column direction (an arrangement direction of the pixels in a pixel column), for each pixel column, with respect to the arrangement of the pixels 20 in m rows and n columns.

Each of the scanning lines $31_1$ to $31_m$ is connected to an output end of a row corresponding to the writing scanning unit 40. Each of the first driving lines $32_1$ to $32_m$ is connected to an output end of a row corresponding to the first driving scanning unit 50A. Each of the second driving lines $33_1$ to $33_m$ is connected to an output end of a row corresponding to the second driving scanning unit 50B. Each of the signal lines $34_1$ to $34_n$ is connected to an output end of a column corresponding to the signal output unit 60.

The writing scanning unit 40 includes a shift register circuit or the like. The writing scanning unit 40 performs so-called line-sequential scanning in which a writing scanning signal WS ($WS_1$ to $WS_m$) is sequentially supplied to the scanning line 31 ($31_1$ to $31_m$) at the time of writing a signal electrical voltage of a video signal with respect to each of the pixels 20 of the pixel array portion 30, and thus, each of the pixels 20 of the pixel array portion 30 is sequentially scanned in column unit.

The first driving scanning unit 50A includes a shift register circuit or the like, as with the writing scanning unit 40. The first driving scanning unit 50A performs control of light emitting/non-light emitting (quenching) of the pixel 20 by supplying a light emitting control signal DS ($DS_1$ to $DS_m$) to the first driving line 32 ($32_1$ to $32_m$), in synchronization with the line-sequential scanning of the writing scanning unit 40.

The second driving scanning unit 50B includes a shift register circuit or the like, as with the writing scanning unit 40. The second driving scanning unit 50B performs control such that the pixel 20 does not emit light in a non-light emitting period, by supplying a driving signal AZ ($AZ_1$ to $AZ_m$) to the second driving line 33 ($33_1$ to $33_m$), in synchronization with the line-sequential scanning of the writing scanning unit 40.

The signal output unit 60 selectively outputs the signal electrical voltage $V_{sig}$ of the video signal (hereinafter, also simply referred to as a "signal electrical voltage") according to brightness information supplied from a signal supply source (not illustrated), and a reference electrical voltage $V_{ofs}$. Here, the reference electrical voltage $V_{ofs}$ is an electrical voltage corresponding to an electrical voltage to be a reference of the signal electrical voltage $V_{sig}$ of the video signal (for example, an electrical voltage corresponding to a black level of the video signal), or an electrical voltage in the vicinity thereof. The reference electrical voltage $V_{ofs}$ is used as an initialization electrical voltage at the time of performing a correction operation as described later.

The signal electrical voltage $V_{sig}$/reference electrical voltage $V_{ofs}$ to be alternatively output from the signal output unit 60, is written with respect to each of the pixels 20 of the pixel array portion 30 through the signal line 34 ($34_1$ to $34_n$), in the unit of a pixel row selected by the line-sequential scanning of the writing scanning unit 40. That is, the signal output unit 60 adopts a driving mode of line-sequential writing of writing the signal electrical voltage $V_{sig}$ in pixel row (line) unit.

[Pixel Circuit]

Figure 2:
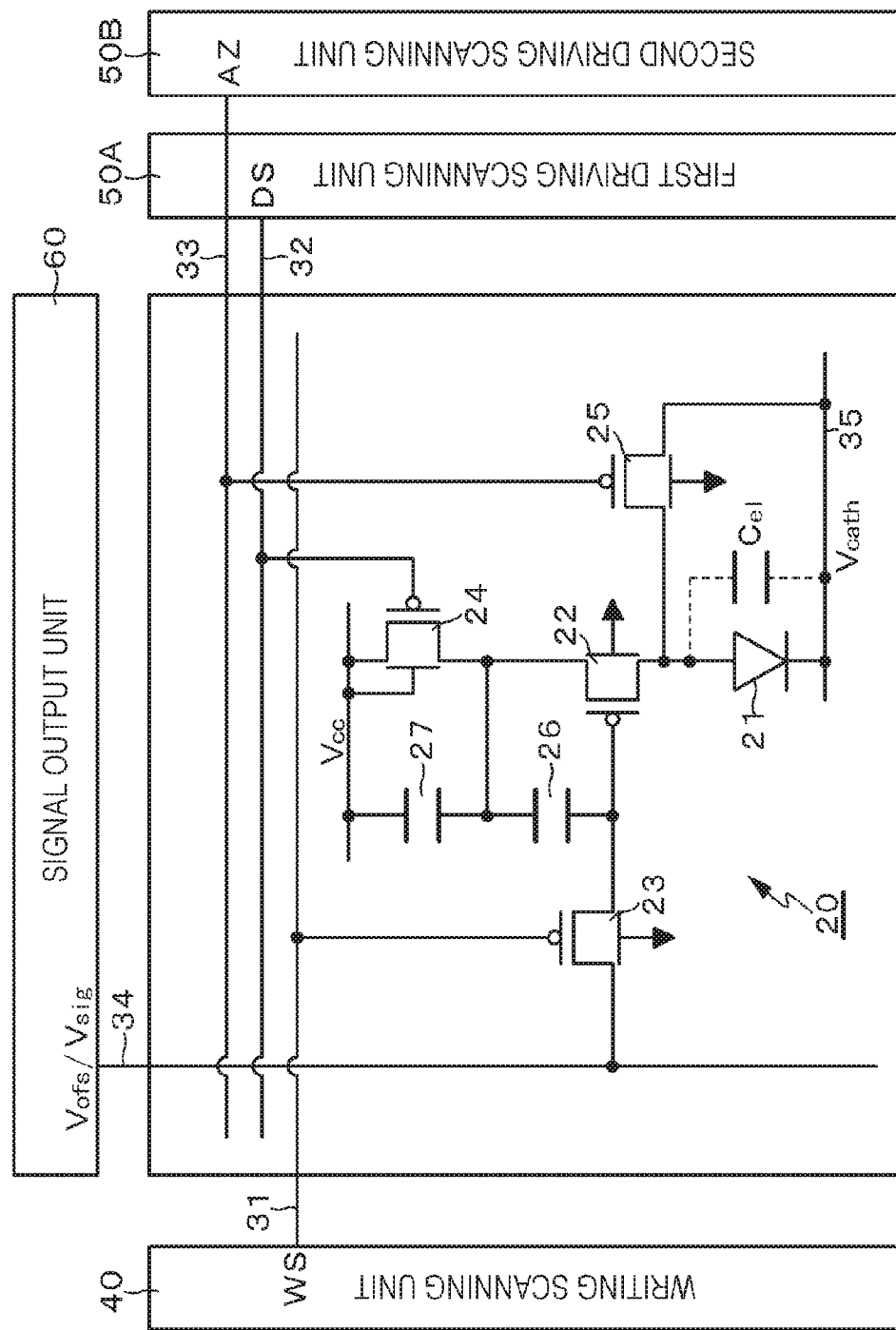
FIG. 2 is a circuit diagram illustrating an example of a circuit configuration of a pixel (a pixel circuit) in the active matrix type organic EL display device of the present disclosure.

FIG. 2 is a circuit diagram illustrating an example of a circuit configuration of the pixel (the pixel circuit) in the active matrix type organic EL display device 10 of the present disclosure. The light emitting unit of the pixel 20 includes an organic EL element 21. The organic EL element 21 is an example of an electrical current driving type electrooptical element in which a light emitting brightness is changed according to an electrical current value flowing through a device.

As illustrated in FIG. 2, the pixel 20 includes the organic EL element 21, and a driving circuit unit driving the organic EL element 21 by allowing an electrical current to flow through the organic EL element 21. In the organic EL element 21, a cathode electrode is connected to a common power line 35 wired in common to all of the pixels 20.

The driving circuit unit driving the organic EL element 21 has a 4Tr (transistor)/2C (capacitative element) configuration including a driving transistor 22, a writing transistor (a sampling transistor) 23, a light emitting control transistor 24, a switching transistor 25, a retentive capacitance 26, and an auxiliary capacitance 27. Furthermore, in this example, the pixel (the pixel circuit) 20 is formed on a semiconductor such as silicon, but not on an insulating body such as a glass substrate. Then, the driving transistor 22 includes a p-channel type transistor.

In addition, in this example, the writing transistor 23, the light emitting control transistor 24, and the switching transistor 25, have a configuration using a p-channel type transistor, as with the driving transistor 22. Accordingly, the driving transistor 22, the writing transistor 23, the light emitting control transistor 24, and the switching transistor 25 have a four-terminal configuration of Source/Gate/Drain/Back Gate, but not a three-terminal configuration of Source/Gate/Drain. A power electrical voltage $V_{cc}$ is applied to the back gate of each of the transistor.

In the pixel 20 having the configuration described above, the writing transistor 23 writes the signal electrical voltage $V_{sig}$ which is supplied from the signal output unit 60 through the signal line 34, in a gate electrode of the driving transistor 22, by sampling the signal electrical voltage $V_{sig}$. The light emitting control transistor 24 is connected between a power line of the power electrical voltage $V_{cc}$ and a source electrode of the driving transistor 22, and performs the control of the light emitting/non-light emitting of the organic EL element 21, under the driving of the light emitting control signal DS. The switching transistor 25 is connected between a drain electrode of the driving transistor 22 and an electrical current discharge destination node (for example, the common power line 35), and performs the control such that the organic EL element 21 does not emit light in the non-light emitting period of the organic EL element 21, under the driving of the driving signal AZ.

The retentive capacitance 26 is connected between the gate electrode and the source electrode of the driving transistor 22, and retains the signal electrical voltage $V_{sig}$ which is written by the sampling of the writing transistor 23. The driving transistor 22 drives the organic EL element 21 by allowing a driving electrical current according to a retentive electrical voltage of the retentive capacitance 26 to flow through the organic EL element 21. The auxiliary capacitance 27 is connected between the source electrode of the driving transistor 22, and a node of a fixed electrical potential (for example, the power line of the power electrical voltage $V_{cc}$). The auxiliary capacitance 27 has an action of suppressing a variation in a source electrical voltage of the driving transistor 22 at the time of writing the signal electrical voltage $V_{sig}$, and an action of setting a gate-source electrical voltage $V_{gs}$ of the driving transistor 22 to a threshold value electrical voltage $V_{th}$ of the driving transistor 22.

[Basic Circuit Operation]

Here, a basic circuit operation of the active matrix type organic EL display device 10 having the configuration described above, will be described by using a timing waveform diagram of FIG. 3.

Figure 3:
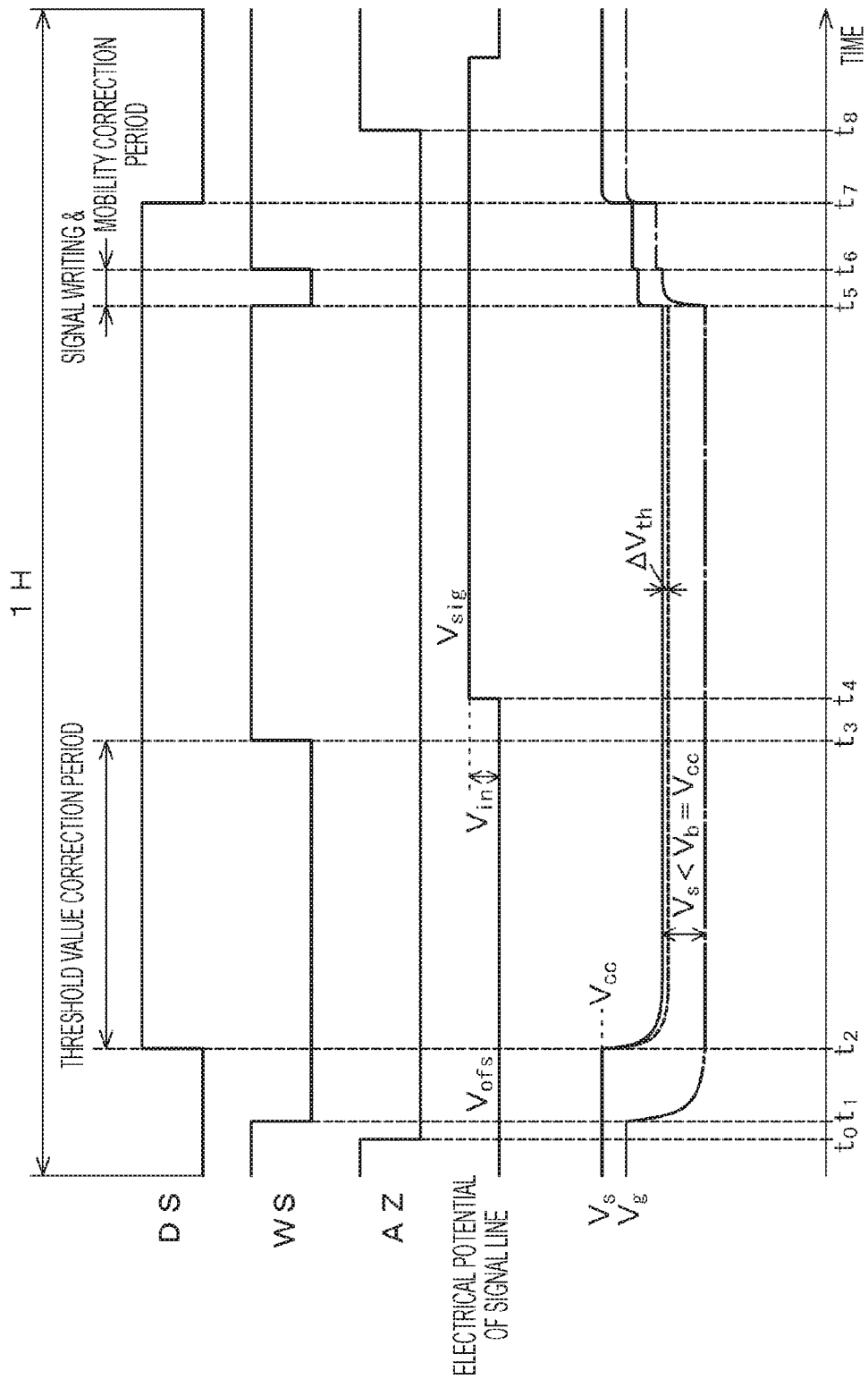
FIG. 3 is a timing waveform diagram for illustrating a basic operation of the active matrix type organic EL display device.

The timing waveform diagram of FIG. 3 illustrates a change state of each of the light emitting control signal DS, the writing scanning signal WS, the driving signal AZ, an electrical potential $V_{ofs}/V_{sig}$ of the signal line 34, an electrical voltage $V_s$ and a gate electrical voltage $V_g$ of the driving transistor 22.

Furthermore, the writing transistor 23, the light emitting control transistor 24, and the switching transistor 25 are a p-channel type transistor, and thus, a low level state of the writing scanning signal WS, the light emitting control signal DS, and the driving signal AZ is an active state, and a high level state thereof is an inactive state. Then, the writing transistor 23, the light emitting control transistor 24, and the switching transistor 25 are in a conductive state, in the active state of the writing scanning signal WS, the light emitting control signal DS, and the driving signal AZ, and are in a non-conductive state, in the inactive state.

The writing scanning signal WS is transitioned from a high level to a low level at a time $t_1$, and thus the writing transistor 23 is in the conductive state. At this time, it is a state in which the reference electrical voltage $V_{ofs}$ is output to the signal line 34 from the signal output unit 60. Accordingly, the reference electrical voltage $V_{ofs}$ is written in the gate electrode of the driving transistor 22 by the sampling of the writing transistor 23, and thus, the gate electrical voltage $V_g$ of the driving transistor 22 becomes the reference electrical voltage $V_{ofs}$.

In addition, the light emitting control signal DS is in the low level state at the time $t_1$, and thus the light emitting control transistor 24 is in the conductive state. Accordingly, the source electrical voltage $V_s$ of the driving transistor 22 becomes the power electrical voltage $V_{cc}$. At this time, the gate-source electrical voltage $V_{gs}$ of the driving transistor 22 becomes $V_{gs}=V_{ofs}-V_{cc}$.

Here, in order to perform a threshold value correction operation (a threshold value correction processing), it is necessary that the gate-source electrical voltage $V_{gs}$ of the driving transistor 22 is larger than the threshold value electrical voltage $V_{th}$ of the driving transistor 22. For this reason, each electrical voltage value is set such that $|V_{gs}|=|V_{ofs}-V_{cc}|>|V_{th}|$ is satisfied.

Thus, an initialization operation of setting the gate electrical voltage $V_g$ of the driving transistor 22 to the reference electrical voltage $V_{ofs}$, and of setting the source electrical voltage $V_s$ of the driving transistor 22 to the power electrical voltage $V_{cc}$, is an operation of preparation (preparation of threshold value correction) before performing the next threshold value correction operation. Accordingly, the reference electrical voltage $V_{ofs}$ and the power electrical voltage $V_{cc}$ become an initialization electrical voltage of each of the gate electrical voltage $V_g$ and the source electrical voltage $V_s$ of the driving transistor 22.

Next, in a case where the light emitting control signal DS is transitioned from the low level to the high level at a time $t_2$, and the light emitting control transistor 24 is in the non-conductive state, the threshold value correction operation is started in a state where the source electrode of the driving transistor 22 is in a floating state, and the gate electrical voltage $V_g$ of the driving transistor 22 is retained to the reference electrical voltage $V_{ofs}$. That is, the source electrical voltage $V_s$ of the driving transistor 22 is started to fall (decrease) towards an electrical voltage $(V_g-V_{th})$ obtained by subtracting the threshold value electrical voltage $V_{th}$ from the gate electrical voltage $V_g$ of the driving transistor 22.

In the basic operation, on the basis of the initialization electrical voltage $V_{ofs}$ of the gate electrical voltage $V_g$ of the driving transistor 22, an operation of changing the source electrical voltage $V_s$ of the driving transistor 22 towards the electrical voltage $(V_g-V_{th})$ obtained by subtracting the threshold value electrical voltage $V_{th}$ of the driving transistor 22 from the initialization electrical voltage $V_{ofs}$, is the threshold value correction operation. In a case where the threshold value correction operation proceeds, the gate-source electrical voltage $V_{gs}$ of the driving transistor 22 is eventually converged on the threshold value electrical voltage $V_{th}$ of the driving transistor 22. The electrical voltage corresponding to the threshold value electrical voltage $V_{th}$ is retained in the retentive capacitance 26.

Then, in a case where the writing scanning signal WS is transitioned from the low level to the high level at a time $t_3$, and the writing transistor 23 is in the non-conductive state, a threshold value correction period is ended. After that, the signal electrical voltage $V_{sig}$ of the video signal is output from the signal output unit 60 to the signal line 34 at a time $t_4$, and the electrical potential of the signal line 34 is switched from the reference electrical voltage $V_{ofs}$ to the signal electrical voltage $V_{sig}$.

Next, the writing scanning signal WS is transitioned from the high level to the low level at a time $t_5$, and thus, the writing transistor 23 is in the conductive state, and the signal electrical voltage $V_{sig}$ is written in the pixel 20 by the sampling. According to a writing operation of the signal electrical voltage $V_{sig}$ of the writing transistor 23, the gate electrical voltage $V_g$ of the driving transistor 22 becomes the signal electrical voltage $V_{sig}$.

The auxiliary capacitance 27 connected between the source electrode of the driving transistor 22 and the power line of the power electrical voltage $V_{cc}$ has an action of suppressing a variation in the source electrical voltage $V_s$ of the driving transistor 22 at the time of writing the signal electrical voltage $V_{sig}$ of the video signal. Then, the threshold value electrical voltage $V_{th}$ of the driving transistor 22 is offset by an electrical voltage corresponding to the threshold value electrical voltage $V_{th}$ retained in the retentive capacitance 25, at the time of driving the driving transistor 22 according to the signal electrical voltage $V_{sig}$ of the video signal.

At this time, the gate-source electrical voltage $V_{gs}$ of the driving transistor 22, is opened (increases) according to the signal electrical voltage $V_{sig}$, but the source electrical voltage $V_s$ of the driving transistor 22 remains in the floating state. For this reason, a charged electrical charge of the retentive capacitance 26 is discharged according to the characteristics of the driving transistor 22. In addition, at this time, an equivalent capacitance $C_{el}$ of the organic EL element 21 is started to be charged, according to an electrical current flowing through the driving transistor 22.

The equivalent capacitance $C_{el}$ of the organic EL element 21 is charged, and thus, the source electrical voltage $V_s$ of the driving transistor 22 gradually falls as time elapses. At this time, a variation in the threshold value electrical voltage $V_{th}$ of the driving transistor 22 in each of the pixels is already cancelled, and a drain-source electrical current $I_{ds}$ of the driving transistor 22 depends on a mobility μ of the driving transistor 22. Furthermore, the mobility μ of the driving transistor 22 is a mobility of a semiconductor thin film configuring a channel of the driving transistor 22.

Here, a falling amount of the source electrical voltage $V_s$ of the driving transistor 22, acts to discharge the charged electrical charge of the retentive capacitance 26. In other words, in the falling amount (a change amount) of the source electrical voltage $V_s$ of the driving transistor 22, a negative feedback is applied to the retentive capacitance 26. Accordingly, the falling amount of the source electrical voltage $V_s$ of the driving transistor 22 is a feedback amount of the negative feedback.

Thus, the negative feedback is applied to the retentive capacitance 26 by the feedback amount according to the drain-source electrical current $I_{ds}$ flowing through the driving transistor 22, and thus, the dependency of the drain-source electrical current $I_{ds}$ of the driving transistor 22 with respect to the mobility μ can be cancelled out. Such a cancelling operation (cancelling processing) is a mobility correction operation (mobility correction processing) of correcting a variation in the mobility μ of the driving transistor 22 in each of the pixels.

More specifically, the drain-source electrical current $I_{ds}$ increases as a signal amplitude $V_{in}$ ($=V_{sig}-V_{ofs}$) of the video signal which is written in the gate electrode of the driving transistor 22 increases, and thus, the absolute value of the feedback amount of the negative feedback also increases. Accordingly, the mobility correction processing according to the signal amplitude $V_{in}$ of the video signal, that is, a light emitting brightness level, is performed. In addition, in a case where the signal amplitude $V_{in}$ of the video signal is constant, as the mobility μ of the driving transistor 22 increases, the absolute value of the feedback amount of the negative feedback also increases, and thus, it is possible to remove a variation in the mobility μ in each of the pixels.

The writing scanning signal WS is transitioned from the low level to the high level at a time $t_6$, and the writing transistor 23 is in the non-conductive state, and thus, a signal writing & mobility correction period is ended. The light emitting control signal DS is transitioned from the high level to the low level at a time $t_7$ after the mobility correction is performed, and thus, the light emitting control transistor 24 is in the conductive state. With this arrangement, an electrical current is supplied to the driving transistor 22 from the power line of the power electrical voltage $V_{cc}$ through the light emitting control transistor 24.

At this time, the writing transistor 23 is in the non-conductive state, and thus, the gate electrode of the driving transistor 22 is in the floating state by being electrically separated from the signal line 34. Here, when the gate electrode of the driving transistor 22 is in the floating state, the retentive capacitance 26 is connected between the gate and the source of the driving transistor 22, and thus, the gate electrical voltage $V_g$ also varies in tandem with a variation in the source electrical voltage $V_s$ of the driving transistor 22.

That is, the source electrical voltage $V_s$ and the gate electrical voltage $V_g$ of the driving transistor 22 rise while retaining the gate-source electrical voltage $V_{gs}$ retained in the retentive capacitance 26. Then, the source electrical voltage $V_s$ of the driving transistor 22 rises to a light emitting electrical voltage $V_{oled}$ of the organic EL element 21 according to a saturated electrical current of the transistor.

Thus, an operation in which the gate electrical voltage $V_g$ of the driving transistor 22 varies in tandem with a variation in the source electrical voltage $V_s$, is a bootstrap operation. In other words, the bootstrap operation is an operation in which the gate electrical voltage $V_g$ and the source electrical voltage $V_s$ of the driving transistor 22 vary while retaining the gate-source electrical voltage $V_{gs}$ retained in the retentive capacitance 26, that is, an electrical voltage between both ends of the retentive capacitance 26.

Then, the drain-source electrical current $I_{ds}$ of the driving transistor 22 is started to flow through the organic EL element 21, and thus, an anode electrical voltage $V_{ano}$ of the organic EL element 21 rises according to the electrical current $I_{ds}$. In a case where the anode electrical voltage $V_{ano}$ of the organic EL element 21 eventually exceeds a threshold value electrical voltage $V_{thel}$ of the organic EL element 21, a driving electrical current is started to flow through the organic EL element 21, and thus, the organic EL element 21 is started to emit light.

On the other hand, the second driving scanning unit 50B sets the driving signal AZ to be in the active state (the low level state) during a period from a time $t_0$ before the time $t_1$, to a time $t_0$ after the time $t_7$. The period of time $t_0$-time $t_0$, is the non-light emitting period of the organic EL element 21. The driving signal AZ is in the active state during the non-light emitting period, and thus, in response thereto, the switching transistor 25 is in the conductive state.

The switching transistor 25 is in the conductive state, and thus, the drain electrode of the driving transistor 22 through the switching transistor 25 (an anode electrode of the organic EL element 21) and the common power line 35, which is the electrical current discharge destination node, are electrically short-circuited. Here, on resistance of the switching transistor 25 is considerably smaller than that of the organic EL element 21. Accordingly, in the non-light emitting period of the organic EL element 21, the electrical current flowing through the driving transistor 22 is made compulsorily flow in the common power line 35 without flowing in the organic EL element 21. Incidentally, in 1H where the threshold value correction and the signal writing are performed, the driving signal AZ is in the active state, but in the subsequent light emitting period, the driving signal AZ is in the inactive state.

Here, focus on an operation point from a threshold value correction preparation period to the threshold value correction period (the time $t_1$ to the time $t_3$) in a pixel configuration not including the switching transistor 25. As it is obvious from the above description of the operation, it is necessary that the gate-source electrical voltage $V_{gs}$ of the driving transistor 22 is larger than the threshold value electrical voltage $V_{th}$ of the driving transistor 22, in order to perform the threshold value correction operation.

In a case where the gate-source electrical voltage $V_{gs}$ is larger than the threshold value electrical voltage $V_{th}$, an electrical current flows through the driving transistor 22. Then, in a part of the threshold value correction preparation period to the threshold value correction period, the anode electrical voltage $V_{ano}$ of the organic EL element 21 temporarily exceeds the threshold value electrical voltage $V_{thel}$ of the organic EL element 21. With this arrangement, the electrical current flows in the organic EL element 21 from the driving transistor 22, and thus, the organic EL element 21 emits light with a constant brightness even in the non-light emitting period, in each frame, regardless of the gradation of the signal electrical voltage $V_{sig}$. As a result thereof, the contrast of the display panel 70 decreases.

In contrast, in the pixel configuration including the switching transistor 25, it is possible to prevent the electrical current flowing through the driving transistor 22 from flowing in the organic EL element 21 in the non-light emitting period of the organic EL element 21, according to the action of the switching transistor 25 described above. With this arrangement, in the non-light emitting period, the organic EL element 21 is prevented from emitting light, and thus, high contrast of the display panel 70 can be obtained, compared to the pixel configuration not including the switching transistor 25.

In a set of basic circuit operations described above, each operation of the threshold value correction preparation, the threshold value correction, the writing of the signal electrical voltage $V_{sig}$ of the video signal (signal writing), and the mobility correction, for example, is executed in one horizontal period (1H).

[Pixel Structure]

Figure 4:
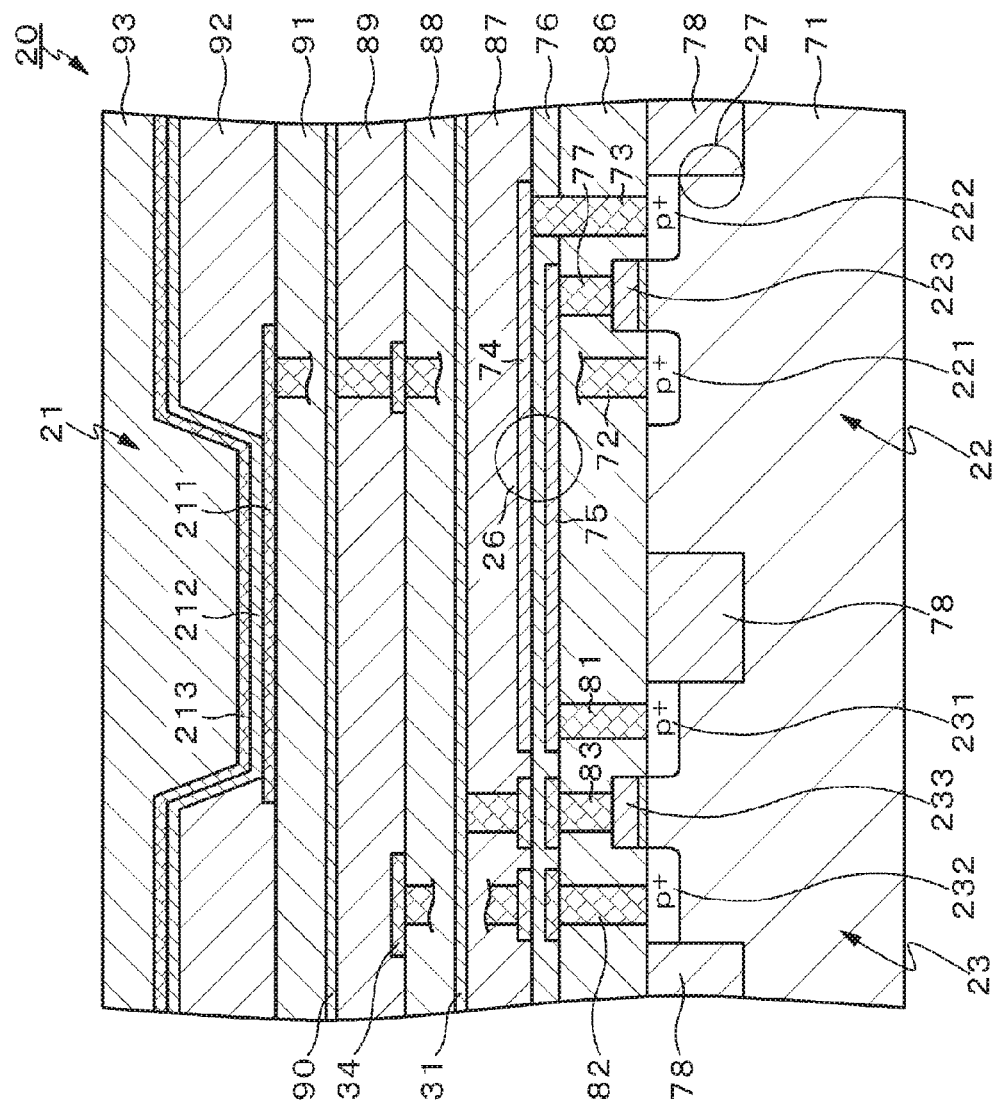
FIG. 4 is a sectional view illustrating an example of a sectional structure of the pixel.

Subsequently, a pixel structure of the pixel 20 will be described by using FIG. 4. FIG. 4 is a sectional view illustrating an example of a sectional structure of the pixel 20. Here, a sectional structure of a main part of the pixel 20 is schematically illustrated. Here, the pixel structure illustrated in FIG. 4 is an example, and the pixel structure is not limited thereto.

As illustrated in FIG. 4, the driving transistor 22, the writing transistor 23, the light emitting control transistor 24, and the switching transistor 25, including a p-channel type transistor, are disposed on an n type semiconductor substrate 71 including silicon. FIG. 4 illustrates only the driving transistor 22 and the writing transistor 23, in order to simplify the drawing.

In the driving transistor 22, one source/drain region 221 is connected to a first electrode 211 of the organic EL element 21 through a contact portion 72, and functions as a drain region when the organic EL element 21 emits light. The other source/drain region 222 is connected to wiring 74 through a contact portion 73, and functions as a source region when the organic EL element 21 emits light. A gate electrode 223 is connected to wiring 75 through a contact portion 77.

Here, the wiring 74 is used as one electrode of the retentive capacitance 26, and the wiring 75 is used as the other electrode of the retentive capacitance 26. That is, the retentive capacitance 26 (in FIG. 4, illustrated as a portion surrounded by a circle) includes the wiring 74 being one electrode (one end), the wiring 75 being the other electrode (the other end), and a dielectric layer (an insulating layer) 76 interposed between the wirings 74 and 75. The driving transistor 22, the writing transistor 23, and the like, are surrounded by an element separation region 78 including an insulating film.

In the writing transistor 23, one source/drain region 231 is connected to the gate electrode 223 of the driving transistor 22 through a contact portion 81, the wiring 75, and the contact portion 77, and functions as a drain region at the time of writing the signal electrical voltage $V_{sig}$ of the video signal. The other source/drain region 232 is connected to the signal line 34 extending along a direction orthogonal to the paper plane through a contact portion 82, and functions as a source region at the time of writing the signal electrical voltage $V_{sig}$ of the video signal. A gate electrode 233 is connected to the scanning line 31 through a contact portion 83.

The contact portions 72, 73, 77, and 81 to 83 are disposed so as not to be short-circuited with the scanning line 31 or the like, extending along a right-left direction (a first direction) in the drawing, and in FIG. 4, such a state is illustrated.

The driving transistor 22, the writing transistor 23, or the like, disposed on the semiconductor substrate 71, is covered with an interlayer insulating layer 86. Then, the other electrode (the wiring 75) and the dielectric layer (the insulating layer) 76 of retentive capacitance 26 are formed on the interlayer insulating layer 86, and one electrode (the wiring 74) of the retentive capacitance 26 is formed on the dielectric layer (the insulating layer) 76. In addition, an interlayer insulating layer 87 is formed on the dielectric layer (the insulating layer) 76 and one electrode (the wiring 74) of the retentive capacitance 26, and the scanning line 31 is formed on the interlayer insulating layer 87.

Further, an interlayer insulating layer 88 is formed on the interlayer insulating layer 87 and the scanning line 31, and the signal line 34 is formed on the interlayer insulating layer 88. In addition, an interlayer insulating layer 89 is formed on the interlayer insulating layer 88 and the signal line 34, and a power supply line 90 is formed on the interlayer insulating layer 89. Further, an interlayer insulating layer 91 is formed on the interlayer insulating layer 89 and the power supply line 90, an anode electrode 211 configuring the organic EL element 21 is formed on the interlayer insulating layer 91.

In addition, an interlayer insulating layer 92 including an opening portion in which the anode electrode 211 is exposed to a bottom portion, is formed on the interlayer insulating layer 91 and the anode electrode 211. Further, an organic material layer configuring the organic EL element 21 (a laminated structure of a hole transport layer, a light emitting layer, and an electron transport layer) 212, and a cathode electrode 213 are formed on the interlayer insulating layer 92 and the anode electrode 211, and an insulating layer 93 is formed on the cathode electrode 213.

A lamination order of the scanning line 31, the signal line 34, the power supply line 90, and the like, is not limited to the lamination order described above, and is substantially arbitrary. The cathode electrode 213 of the organic EL element 21 is connected to the common power line 35 (refer to FIG. 2), and a predetermined cathode electrical voltage $V_{cath}$ is supplied to the common power line 35.

The manufacturing of the pixel 20 described above, can be performed on the basis of a known method, and various materials used for manufacturing the pixel 20 can be known materials. In the example described above, a case where the semiconductor substrate 71 is an n type semiconductor substrate, is exemplified. In a case where the semiconductor substrate 71 is a p type semiconductor substrate, one source/drain region 221 and the other source/drain region 222 of the driving transistor 22, and one source/drain region 231 and the other source/drain region 232 of the writing transistor 23, are disposed within an n type well formed on the p type semiconductor substrate 71.

[Capacitative Element Built in Semiconductor Substrate]

As described above, the retentive capacitance 26 has a structure using a wiring layer. Specifically, the retentive capacitance 26 has a structure in which the wiring 74 is set to one electrode, the wiring 75 is set to the other electrode, and the dielectric layer (the insulating layer) 76 is interposed between the wiring 74 and the wiring 75. In contrast, in the organic EL display device 10 according to this embodiment, the auxiliary capacitance 27 is built in the semiconductor substrate 71. In this embodiment, the auxiliary capacitance 27 is built in a portion surrounded by a circle in FIG. 4, on the semiconductor substrate 71. Hereinafter, specific examples of the auxiliary capacitance 27 built in the semiconductor substrate 71 will be described.

Example 1

Figure 5A:
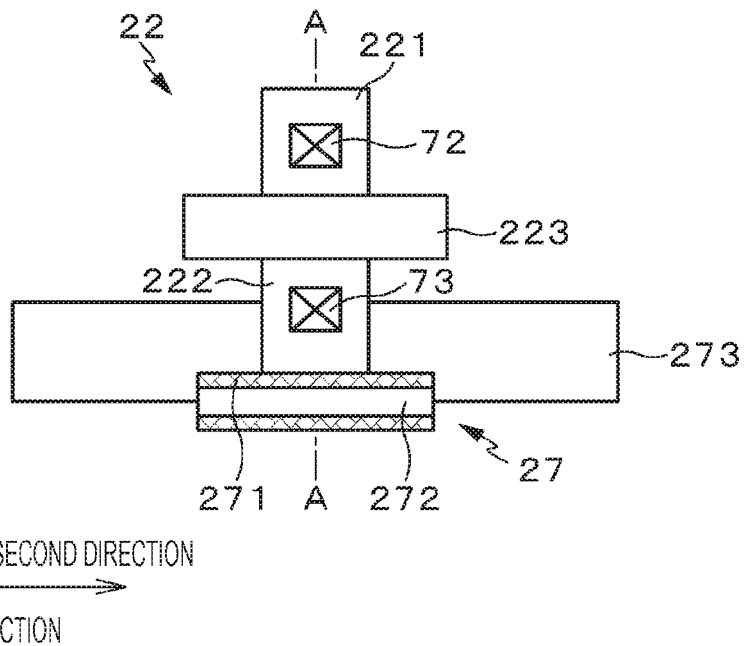
FIG. 5A is a schematic plan view illustrating a capacitative element according to Example 1.
Figure 5B:
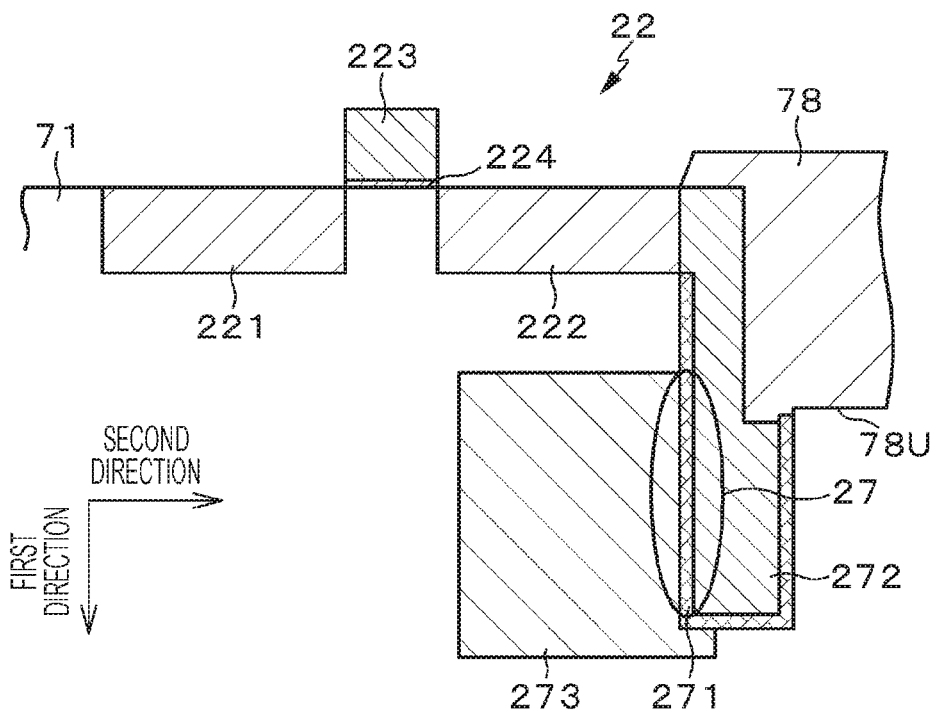
FIG. 5B is a sectional view illustrating a sectional structure along line A-A of FIG. 5A.

A schematic plan view of a capacitative element according to Example 1 is illustrated in FIG. 5A, and a sectional view along line A-A of FIG. 5A is illustrated in FIG. 5B. In FIG. 5A and FIG. 5B, the driving transistor 22 and the auxiliary capacitance 27 are illustrated.

One source/drain region (a diffusion layer region) 221 and the other source/drain region (a diffusion layer region) 222 of the driving transistor 22, and an element separation region 78 are formed in a surface layer portion of the semiconductor substrate 71 including silicon. In addition, the gate electrode 223 of the driving transistor 22 is formed in a region between one source/drain region and the other source/drain region 222 on the semiconductor substrate 71, for example, through a gate insulating film 224 including a silicon oxide film. An example of a structure on the semiconductor substrate 71 is as illustrated in FIG. 4.

The capacitative element built in the semiconductor substrate 71, that is, the auxiliary capacitance 27 includes a dielectric layer (an insulating film) 271, a first electrode 272, and a second electrode 273, formed in the semiconductor substrate 71. The dielectric layer (the insulating film) 271 is including a silicon oxide film, a silicon nitride film, or the like, and is formed to be built in the element separation region 78, to extend in the substrate depth direction (the first direction). The dielectric layer 271 functions as a capacitance film of the auxiliary capacitance 27, while electrically separating the first electrode 272 and the semiconductor substrate 71 from each other.

The first electrode 272 is including an electrical conductor such as polysilicon, and is formed to be built in the element separation region 78, to face the dielectric layer 271 on one surface side of the dielectric layer 271. The first electrode 272 is electrically connected to the other source/drain region 222 of the driving transistor 22. Here, it is preferable that lower end portions of the dielectric layer 271 and the first electrode 272 are in a position deeper than a lower end 78U of the element separation region 78, in the substrate depth direction.

The second electrode 273 is including a diffusion layer having a conductivity type opposite to that of the semiconductor substrate 71, and is formed to face the dielectric layer 271 on the other surface side of the dielectric layer 271. That is, the second electrode 273 is formed on the other source/drain region 222 side of the driving transistor 22, but not on the element separation region 78 side. With this arrangement, the dielectric layer 271 and the first electrode 272 are formed in the element separation region 78, and the second electrode 273 is formed in a forming region of the driving transistor 22, and thus, it is not necessary to ensure a dedicated region in order to form the auxiliary capacitance 27. The second electrode 273 is electrically connected to the power line (the line of the power electrical voltage $V_{cc}$ in FIG. 2).

As described above, in a structure where the first electrode (the electrical conductor) 272, the dielectric layer (the insulating film) 271, and the second electrode (the diffusion layer region) 273 are laminated in a direction orthogonal to the substrate depth direction (a second direction), the auxiliary capacitance 27 (in FIG. 5B, illustrated by a portion surrounded by an ellipse) is formed by portions facing each other. In the auxiliary capacitance 27, a capacitance value is determined according to a facing area between the first electrode 272 and the second electrode 273, a distance between both of the electrodes 272 and 273 (=the thickness of the dielectric layer 271), and a dielectric constant of the dielectric layer 271.

According to the auxiliary capacitance 27 of Example 1, having the configuration described above, the dielectric layer 271 and the first electrode 272 are formed in the element separation region 78, and the second electrode 273 is formed in the forming region of the driving transistor 22, and thus, it is not necessary to ensure a dedicated region. In addition, in the auxiliary capacitance 27, the first electrode 272, which is one end of the auxiliary capacitance 27, is electrically connected to the other source/drain region 222 of the driving transistor 22, on the interface of the element separation region 78, and thus, it is not necessary to draw out the wiring in order to electrically connect them.

Thus, the structure in which the auxiliary capacitance 27 is built in the semiconductor substrate 71 is adopted, and thus, it is not necessary to ensure a region for forming the auxiliary capacitance 27 on the semiconductor substrate 71 by using the wiring layer, and as a result thereof, it is possible to reduce the forming region of the driving circuit unit. With this arrangement, it is possible to attain size refinement of the pixel 20, and definition enhancement of a display image.

Next, a manufacturing method of the auxiliary capacitance 27 according to Example 1, will be described by using each sectional view of FIG. 6A, FIG. 6B, FIG. 6C, FIG. 6D, FIG. 7A, FIG. 7B, and FIG. 7C, schematically illustrating each step.

Step 1

Figure 6A:
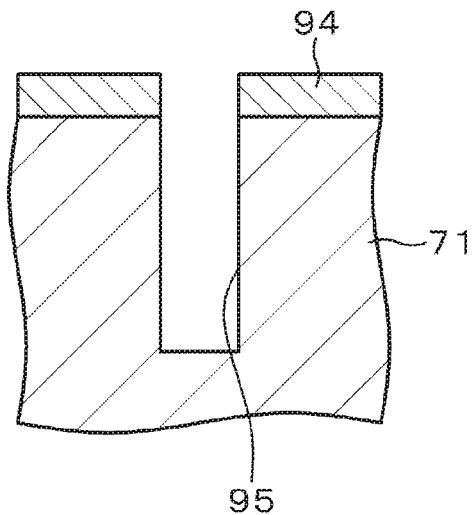
FIG. 6A, FIG. 6B, FIG. 6C, and FIG. 6D are (first) sectional views schematically illustrating steps of a manufacturing method of the capacitative element according to Example 1.

First, a deep groove 95 is formed on the semiconductor substrate 71 by using a resist mask (or a hard mask) 94 (refer to FIG. 6A).

Step 2

Figure 6B:
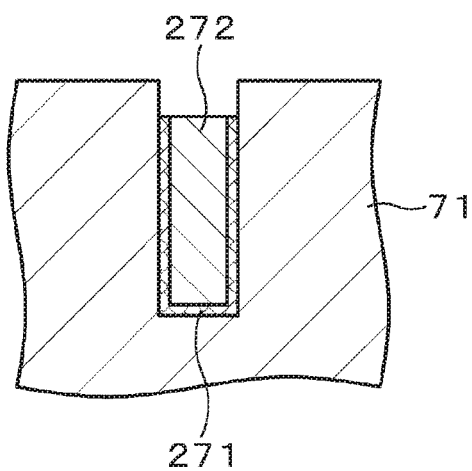

Next, the dielectric layer (the insulating film) 271, and the first electrode 272 including the electrical conductor such as polysilicon, are subjected to film formation, and then, overall dry etching, overall wet etching, or chemical mechanical polishing is performed (refer to FIG. 6B). In this stage, it is necessary that front surfaces of the dielectric layer 271 and the first electrode 272 are in a position deeper than a front surface of the semiconductor substrate 71, in the substrate depth direction.

Step 3

Figure 6C:
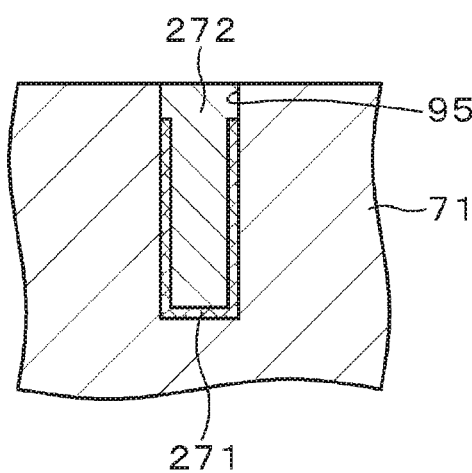

Subsequently, for example, polysilicon is subjected to film formation, as the first electrode (the electrical conductor) 272, and then, dry etching, wet etching, or chemical mechanical polishing is performed, and thus, the groove 95 is filled (refer to FIG. 6C).

Step 4

Figure 6D:
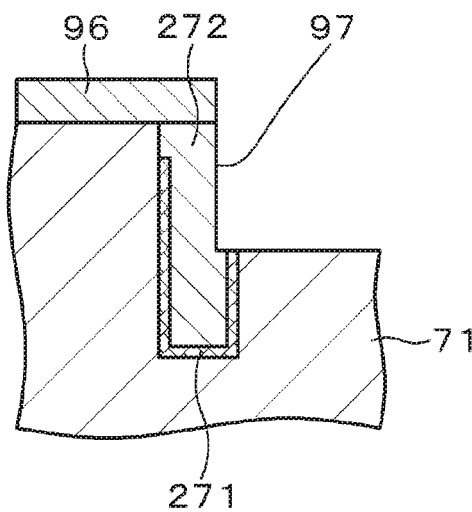

Next, a resist mask (or a hard mask) 96 is patterned to cover a part of the first electrode (the electrical conductor) 272, and then, a groove 97 for separating elements is formed according to a known element separation region (shallow trench isolation) forming technology (refer to FIG. 6D).

Step 5

Figure 7A:
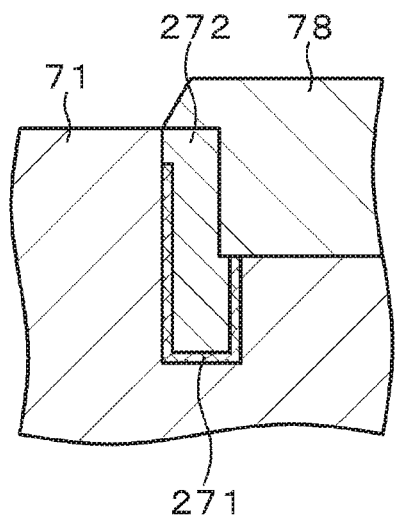
FIG. 7A, FIG. 7B, and FIG. 7C are (second) sectional views schematically illustrating the steps of the manufacturing method of the capacitative element according to Example 1.

After that, the element separation region 78 is including an insulating film for separating elements, for example, a silicon oxide film (refer to FIG. 7A).

Step 6

Figure 7B:
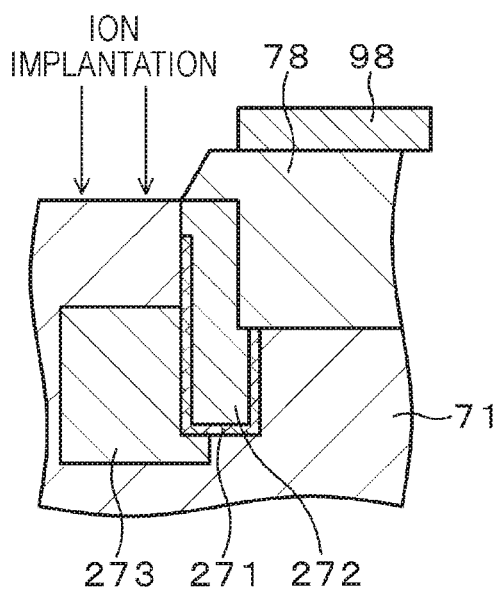

Next, a resist mask (or a hard mask) 98 is patterned on the element separation region 78, and then, the diffusion layer region functioning as the second electrode 273 is formed according to ion implantation (refer to FIG. 7B).

Step 7

Figure 7C:
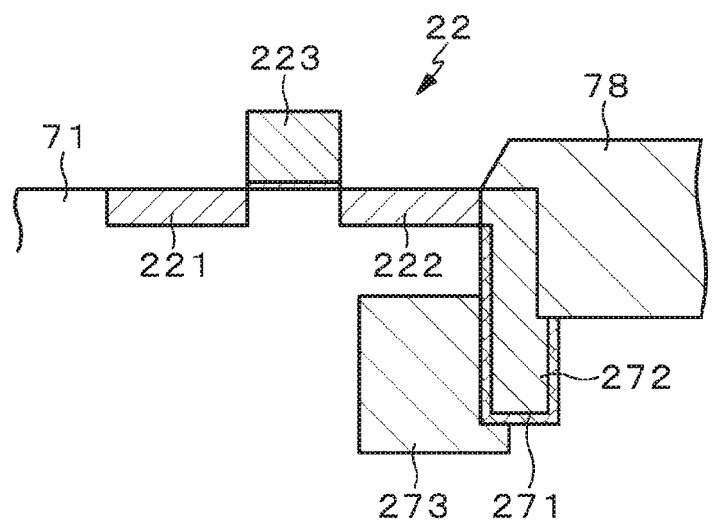

After that, the gate electrode of the driving transistor 22, and the source/drain regions (the diffusion layers) 221 and 222 are formed by a generally expected manufacturing method (refer to FIG. 7C). Various wiring layers, the capacitative element formed by using the wiring layer (in this example, the retentive capacitance 26), or the like, is manufactured by a known manufacturing method.

Example 2

Example 2 is a modification example of Example 1, and is an example of a case where two transistors are arranged on the same diffusion layer in series. A schematic plan view of a capacitative element according to Example 2 is illustrated in FIG. 8A and FIG. 8B.

In the configuration of the driving circuit unit driving the organic EL element 21, it is assumed that two transistors are arranged on the same diffusion layer in series. Here, for example, in the pixel circuit illustrated in FIG. 2, two transistors of the driving transistor 22 and the light emitting control transistor 24 are arranged on the same diffusion layer in series.

Figure 8A:
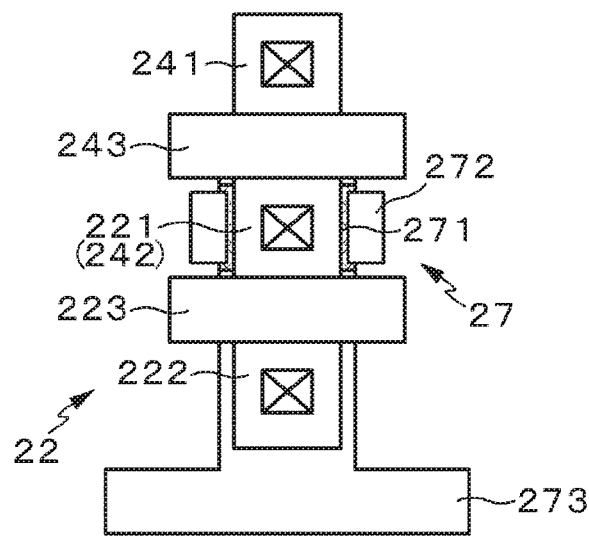
FIG. 8A and FIG. 8B are schematic plan views illustrating a capacitative element according to Example 2.
Figure 8B:
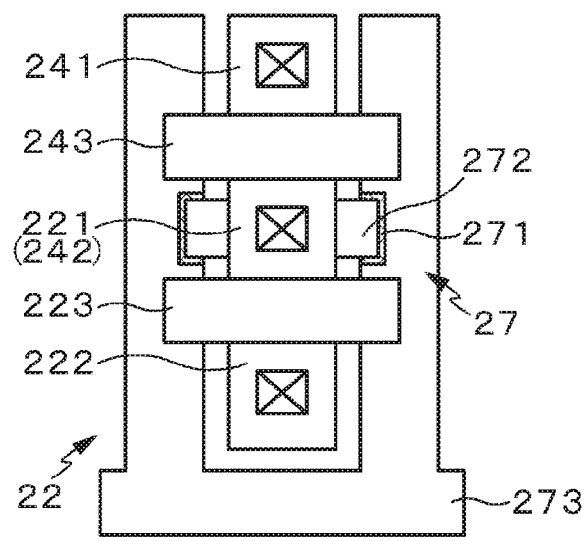

In a case where two transistors are arranged on the same diffusion layer in series in this manner, as illustrated in FIG. 8A or FIG. 8B, it is preferable that the auxiliary capacitance 27 is formed in the vicinity of the source/drain regions (the diffusion layer regions) 221/242 common to the driving transistor 22 and the light emitting control transistor 24.

The auxiliary capacitance 27 according to this modification example, is similar to the auxiliary capacitance 27 according to Example 1, in that the auxiliary capacitance 27 includes the dielectric layer (the insulating film) 271, the first electrode 272, and the second electrode 273, formed in the semiconductor substrate 71. In addition, basically, it is possible to manufacture the auxiliary capacitance 27 according to this modification example by executing processings of steps similar to those of the manufacturing method of the auxiliary capacitance 27 according to Example 1.

Example 3

Figure 9A:
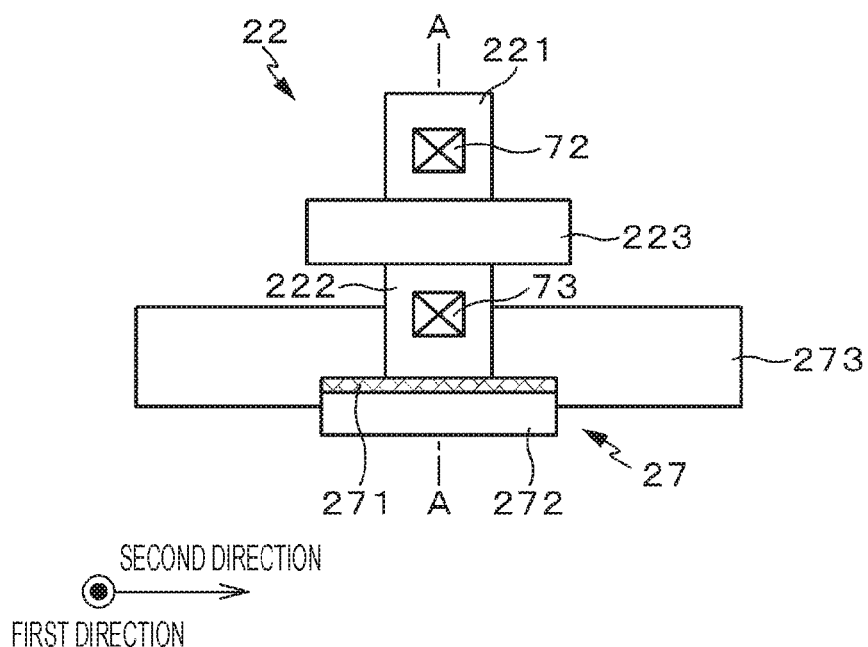
FIG. 9A is a schematic plan view illustrating a capacitative element according to Example 3.
Figure 9B:
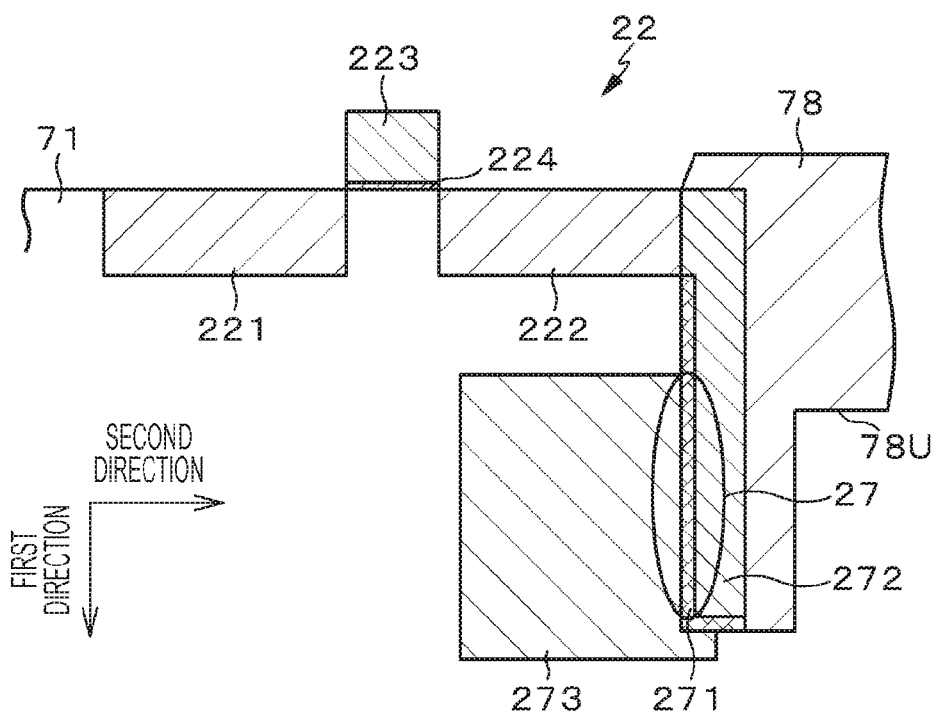
FIG. 9B is a sectional view illustrating a sectional structure along line A-A of FIG. 9A.

Example 3 is a modification example of Example 1. A schematic plan view of a capacitative element of Example 3 is illustrated in FIG. 9A, and a sectional view along line A-A of FIG. 9A is illustrated in FIG. 9B. In FIG. 9A and FIG. 9B, the driving transistor 22 and the auxiliary capacitance 27 are illustrated.

In Example 1, as illustrated in FIG. 5A and FIG. 5B, a structure in which the dielectric layer 271 also exists on a side opposite to the second electrode 273, that is, a structure in which the dielectric layer 271 exists with the first electrode 272 interposed therebetween, is formed. In contrast, in Example 3, as illustrated in FIG. 9A and FIG. 9B, a structure in which the dielectric layer 271 exists only on the second electrode 273 side functioning as one electrode of the auxiliary capacitance 27 is formed.

Next, a manufacturing method of the auxiliary capacitance 27 according to Example 3 will be described by using each sectional view of FIG. 10A, FIG. 10B, FIG. 10C, FIG. 10D, FIG. 11A, FIG. 11B, FIG. 11C, and FIG. 11D, schematically illustrating each step.

Step 1

Figure 10A:
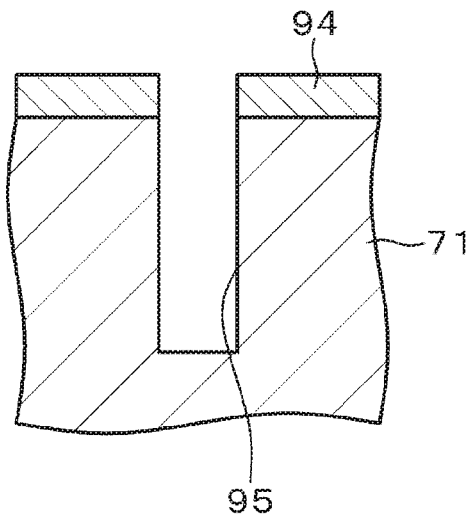
FIG. 10A, FIG. 10B, FIG. 10C, and FIG. 10D are (first) sectional views schematically illustrating steps of a manufacturing method of the capacitative element according to Example 3.

First, the deep groove 95 is formed on the semiconductor substrate 71 by using the resist mask (or the hard mask) 94 (refer to FIG. 10A).

Step 2

Figure 10B:
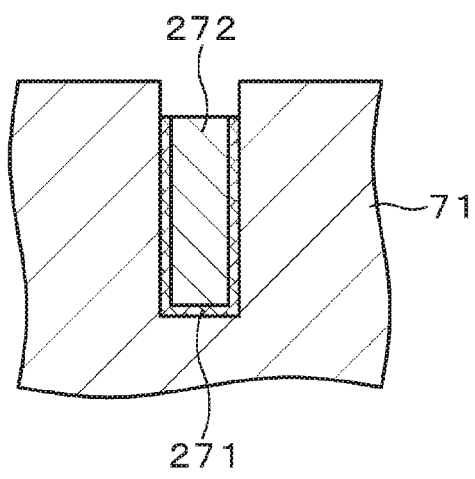

Next, the dielectric layer (the insulating film) 271, and the first electrode 272 including the electrical conductor such as polysilicon, are subjected to film formation, and then, the overall dry etching, the overall wet etching, or the chemical mechanical polishing is performed (refer to FIG. 10B). In this stage, it is necessary that the front surfaces of the dielectric layer 271 and the first electrode 272 are in a position deeper than the front surface of the semiconductor substrate 71, in the substrate depth direction.

Step 3

Figure 10C:
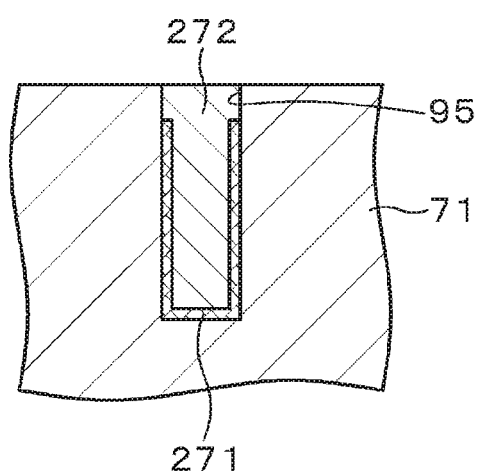

Subsequently, for example, polysilicon is subjected to film formation, as the first electrode (the electrical conductor) 272, and then, dry etching, wet etching, or chemical mechanical polishing is performed, and thus, the groove 95 is filled (refer to FIG. 10C).

Step 4

Figure 10D:
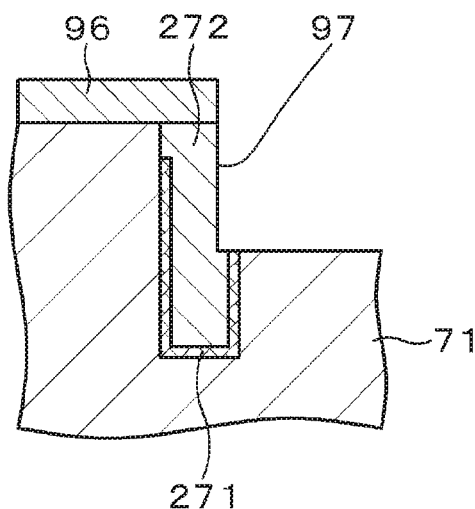

Next, the resist mask (or the hard mask) 96 is patterned to cover a part of the first electrode (the electrical conductor) 272, and then, the groove 97 for separating elements is formed according to a known element separation region forming technology (refer to FIG. 10D).

Step 5

Figure 11A:
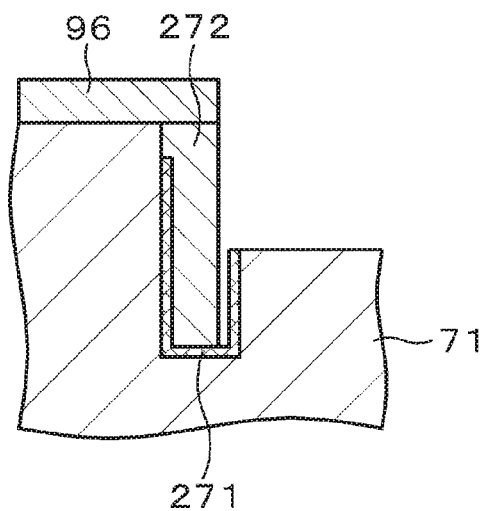
FIG. 11A, FIG. 11B, FIG. 11C, and FIG. 11D are (second) sectional views schematically illustrating the steps of the manufacturing method of the capacitative element according to Example 3.

Next, for example, only the electrical conductor, which is the material of the first electrode 272, is anisotropically eliminated by changing a dry etching condition (refer to FIG. 11A).

Step 6

Figure 11B:
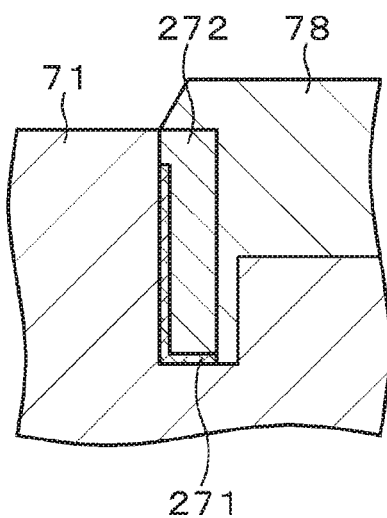

After that, the element separation region 78 is including the insulating film for separating elements, for example, the silicon oxide film (refer to FIG. 11B). At this time, an exposed portion of the dielectric layer 271 is isotropically removed.

Step 7

Figure 11C:
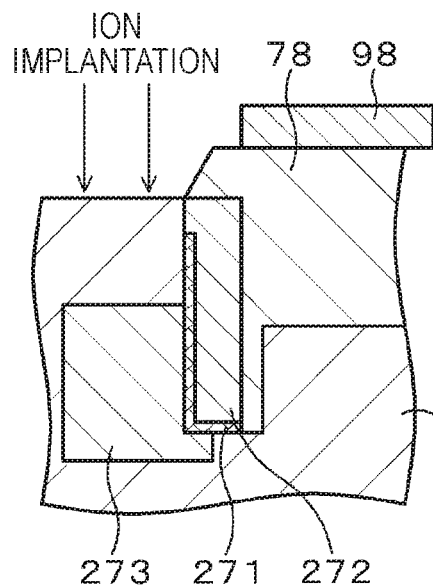

Next, the resist mask (or the hard mask) 98 is patterned on the element separation region 78, and then, the diffusion layer region functioning as the second electrode 273 is formed according to ion implantation (refer to FIG. 11C).

Step 8

Figure 11D:
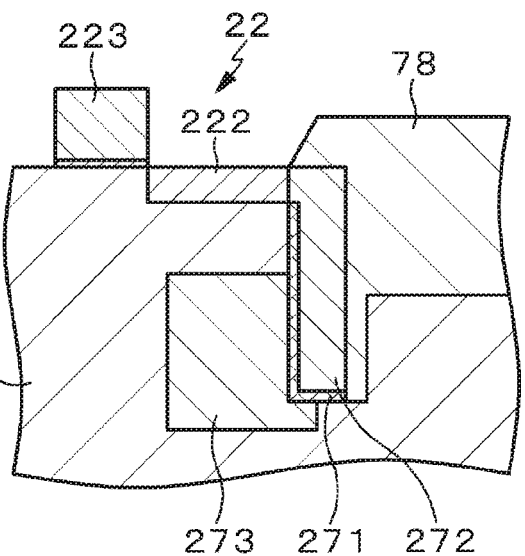

After that, the gate electrode of the driving transistor 22, and the source/drain regions (the diffusion layers) 221 and 222 are formed by a generally expected manufacturing method (refer to FIG. 11D). Various wiring layers, the capacitative element formed by using the wiring layer (in this example, the retentive capacitance 26), or the like, is manufactured by a known manufacturing method.

In the manufacturing method of the capacitative element according to Example 3, a step of eliminating only the electrical conductor (step 5) is added, compared to the manufacturing method of the capacitative element according to Example 1, but even in a case of the structure of the capacitative element according to Example 3, actions and effects similar to those of a case of the structure of the capacitative element according to Example 1, can be obtained. That is, the structure in which the auxiliary capacitance 27 is built in the semiconductor substrate 71 is adopted, and thus, it is not necessary to ensure a region for forming the auxiliary capacitance 27 on the semiconductor substrate 71 by using the wiring layer, and as a result thereof, it is possible to reduce the forming region of the driving circuit unit. With this arrangement, it is possible to attain size refinement of the pixel 20, and definition enhancement of a display image.

Application Example

Figure 12:
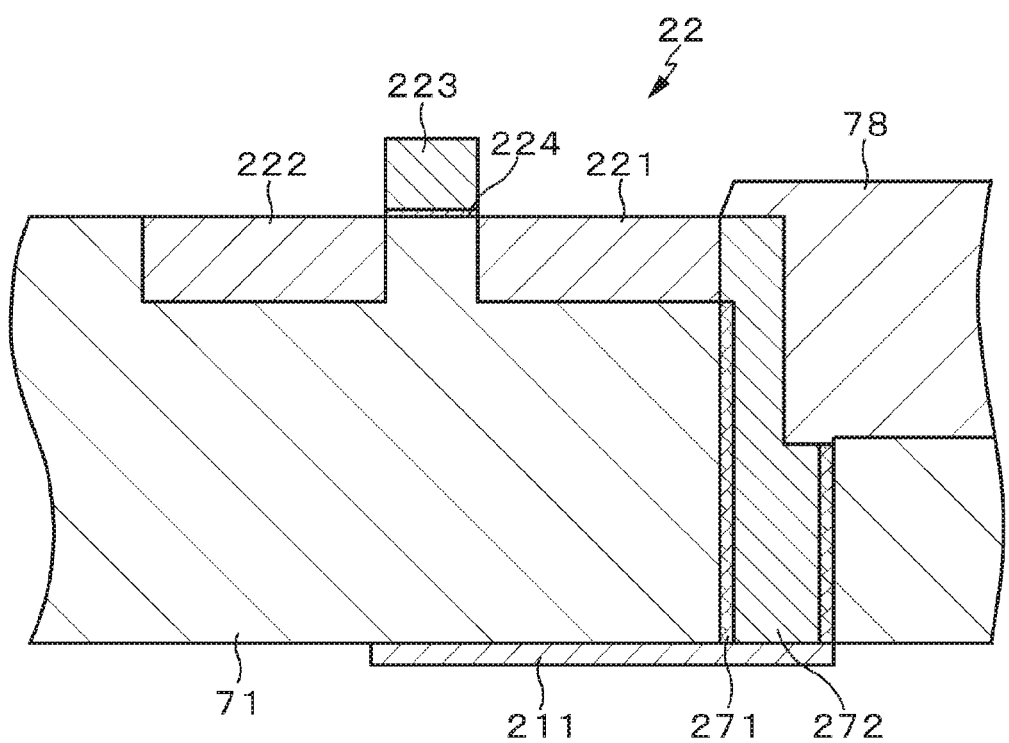
FIG. 12 is a sectional view illustrating a wiring structure according to an application example.

This application example is an example of manufacturing wiring electrically connecting the first surface side and the second surface side of the semiconductor substrate 71 together, by applying the manufacturing method of the auxiliary capacitance 27 according to Example 1. A sectional view of a wiring structure according to the application example is illustrated in FIG. 12.

In the wiring structure according to this application example, the first electrode 272 including the electrical conductor such as polysilicon, which is manufactured by applying the manufacturing method of the auxiliary capacitance 27 according to Example 1, is used as the wiring electrically connecting the first surface side and the second surface side of the semiconductor substrate 71 together. Here, a circuit element such as the driving transistor 22, is formed on the first surface side of the semiconductor substrate 71.

A described above, the first electrode 272 (hereinafter, referred to as "wiring 272") is built in the semiconductor substrate 71, as the wiring electrically connecting the first surface side and the second surface side of the semiconductor substrate 71 together, and thus, the organic EL element 21 manufactured on the first surface side of the semiconductor substrate 71 (refer to FIG. 4), can be manufactured on the second surface side. With this arrangement, another substrate or the like can be laminated on the first surface side of the semiconductor substrate 71. Then, the wiring 272 can be used as wiring connecting one source/drain region 221 of the driving transistor 22 and the anode electrode of the organic EL element 21 together.

Next, a manufacturing method of the wiring structure according to the application example will be described by using each sectional view of FIG. 13A, FIG. 13B, FIG. 13C, FIG. 13D, FIG. 14A, FIG. 14B, FIG. 14C, and FIG. 14D, schematically illustrating each step.

Step 1

Figure 13A:
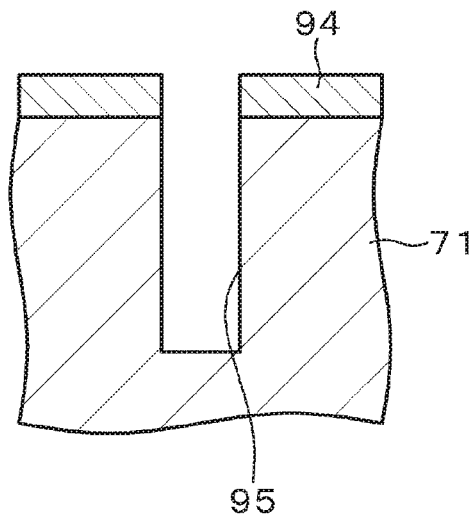
FIG. 13A, FIG. 13B, FIG. 13C, and FIG. 13D are (first) sectional views schematically illustrating steps of a manufacturing method of the wiring structure according to the application example.

First, the deep groove 95 is formed on the semiconductor substrate 71 by using the resist mask (or the hard mask) 94 (refer to FIG. 13A).

Step 2

Figure 13B:
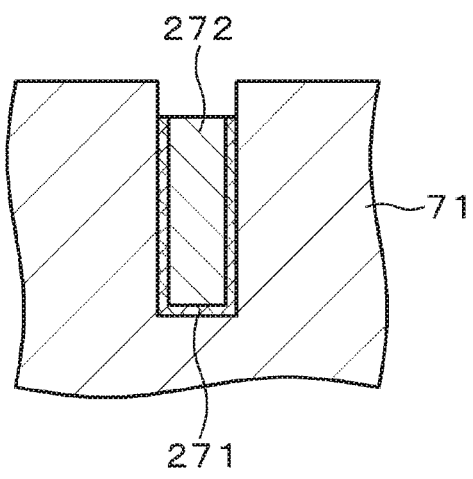

Next, the dielectric layer (the insulating film) 271, and the first electrode 272 including the electrical conductor such as polysilicon, are subjected to film formation, and then, the overall dry etching, the overall wet etching, or the chemical mechanical polishing is performed (refer to FIG. 13B). In this stage, it is necessary that the front surfaces of the dielectric layer 271 and the first electrode 272 are in a position deeper than the front surface of the semiconductor substrate 71, in the substrate depth direction.

Step 3

Figure 13C:
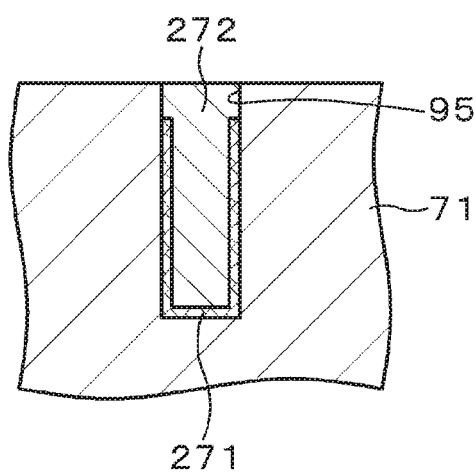

Subsequently, for example, polysilicon is subjected to film formation, as the first electrode (the electrical conductor) 272, and then, the dry etching, the wet etching, or the chemical mechanical polishing is performed, and thus, the groove 95 is filled (refer to FIG. 13C).

Step 4

Figure 13D:
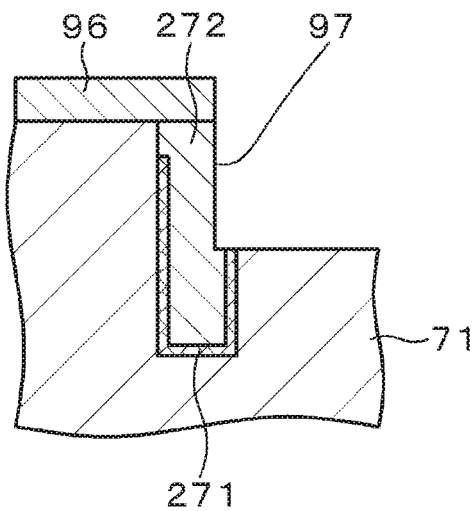

Next, the resist mask (or the hard mask) 96 is patterned to cover a part of the first electrode (the electrical conductor) 272, and then, the groove 97 for separating elements is formed according to a known element separation region forming technology (refer to FIG. 13D).

Step 5

Figure 14A:
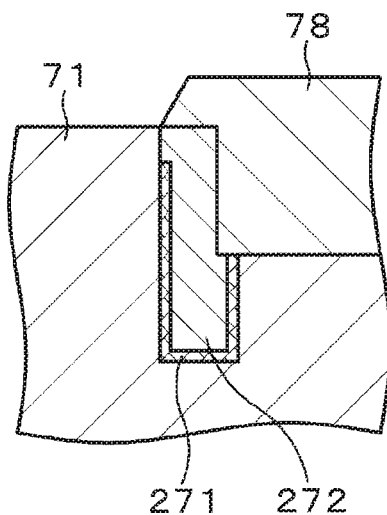
FIG. 14A, FIG. 14B, FIG. 14C, and FIG. 14D are (second) sectional views schematically illustrating the steps of the manufacturing method of the wiring structure according to the application example.

After that, the element separation region 78 is including the insulating film for separating elements, for example, the silicon oxide film (refer to FIG. 14A).

Step 6

Figure 14B:
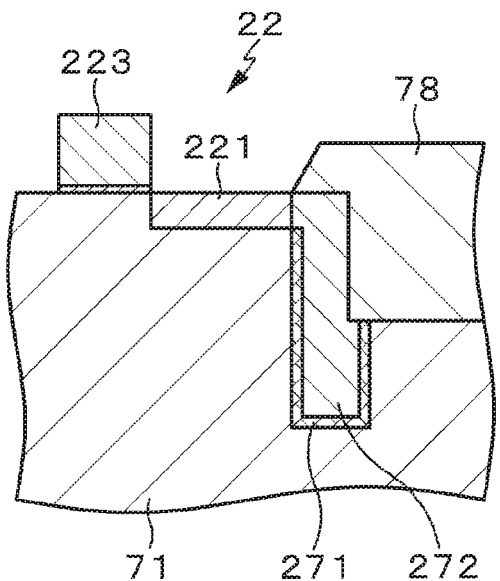

After that, the gate electrode of the driving transistor 22, the source/drain regions (the diffusion layers) 221 and 222 are formed by a generally expected manufacturing method (refer to FIG. 14B).

Next, even though it is not illustrated, various wiring layers, contact portions, or the like is manufactured by a generally expected manufacturing method. Subsequently, even though it is not illustrated, another substrate is bonded to the semiconductor substrate 71 on the first surface side, that is, on the wiring layer side, by a generally expected manufacturing method.

Step 7

Figure 14C:
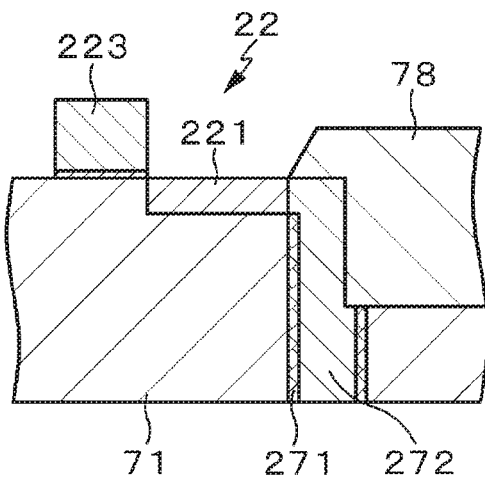

Next, the second surface side of the semiconductor substrate 71, that is, a side opposite to the wiring layer side, is polished by etching or chemical mechanical polishing until a substrate surface of the first electrode (the electrical conductor) 272 is exposed (refer to FIG. 14C).

Step 8

Figure 14D:
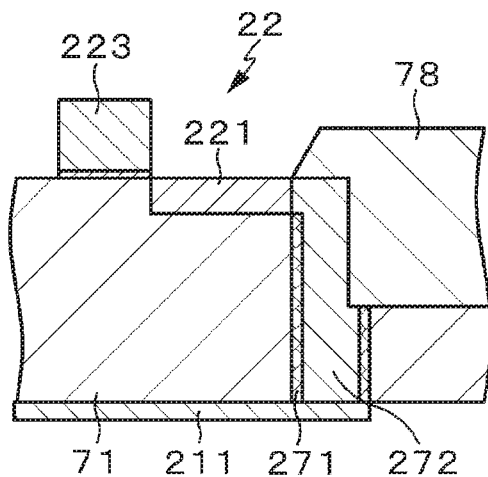

Subsequently, the anode electrode 211 of the organic EL element 21 is patterned in a state of being in electrically contact with the first electrode (the electrical conductor) 272 (refer to FIG. 14D). After that, the organic material layer (the laminated structure of the hole transport layer, the light emitting layer, and the electron transport layer) 212 or the cathode electrode 213 is manufactured by a generally expected manufacturing method.

Furthermore, in this application example, the anode electrode 211 of the organic EL element 21 has been exemplified as an electrode which is patterned on the semiconductor substrate 71 on the second surface side, and is electrically connected to the first electrode (the electrical conductor) 272, but the element electrode is not limited thereto.

Modification Example

As described above, the technology of the present disclosure has been described on the basis of preferred embodiment, but the technology of the present disclosure is not limited to the embodiment described above. The configuration and the structure of the display device described in the embodiment described above are an example, and can be suitably changed. For example, in the embodiment described above, the auxiliary capacitance 27 has been exemplified as the capacitative element built in the semiconductor substrate, but the capacitative element is not limited to the auxiliary capacitance 27. The retentive capacitance 26 can be used as the capacitive element built in the semiconductor substrate, instead of the auxiliary capacitance 27, and both of the retentive capacitance 26 and the auxiliary capacitance 27 can be used as the capacitive element built in the semiconductor substrate.

In addition, in the embodiment described above, the driving circuit unit which is disposed on each of the pixels 20 including the light emitting unit (the organic EL element 21), and drives the light emitting unit, has been exemplified as the circuit unit including the capacitive element to which the technology of the present disclosure is applied, but the circuit unit may be a peripheral circuit unit which is arranged in the vicinity of the pixel array portion 30, and includes the capacitive element. The writing scanning unit 40, the first driving scanning unit 50A, the second driving scanning unit 50B, the signal output unit 60, and the like can be exemplified as the peripheral circuit unit. The technology of the present disclosure is applied to the capacitive element of the peripheral circuit unit, and thus, it is possible to contribute to a reduction in a forming region of the peripheral circuit unit, and furthermore, a reduction in the size of the display device.

<Electronic Device of Present Disclosure>

The display device of the present disclosure described above can be used as a display unit (a display device) of an electronic device in all fields to display a video signal input to the electronic device or a video signal generated in the electronic device, as an image or a video. A television set, a laptop personal computer, a digital still camera, a mobile terminal device such as a mobile phone, a head-mount type display, and the like can be exemplified as the electronic device. However, the electronic device is not limited thereto.

Thus, in the electronic device in all fields, the display device of the present disclosure is used as the display unit, and thus, the following effects can be obtained. That is, according to the display device of the present disclosure, it is not necessary to ensure a region for forming the capacitive element on the semiconductor substrate, and thus, it is possible to reduce the forming region of the circuit unit such as the driving circuit unit or the peripheral circuit unit. Accordingly, it is possible to contribute to a reduction in the size of the main body of the electronic device, by using the display device of the present disclosure.

The display device of the present disclosure also includes a module in the shape of being sealed. A display module in which a facing portion such as transparent glass is pasted to a pixel array portion, corresponds to the module, as an example. Furthermore, in the display module, a circuit unit, a flexible printed circuit (FPC), or the like, for inputting and outputting a signal or the like with respect to a pixel array portion from the outside, may be provided. Hereinafter, a digital still camera and a head-mount type display are exemplified as a specific example of the electronic device using the display device of the present disclosure. However, specific examples exemplified here, are merely example, and the electronic device is not limited thereto.

Specific Example 1

Figure 15A:
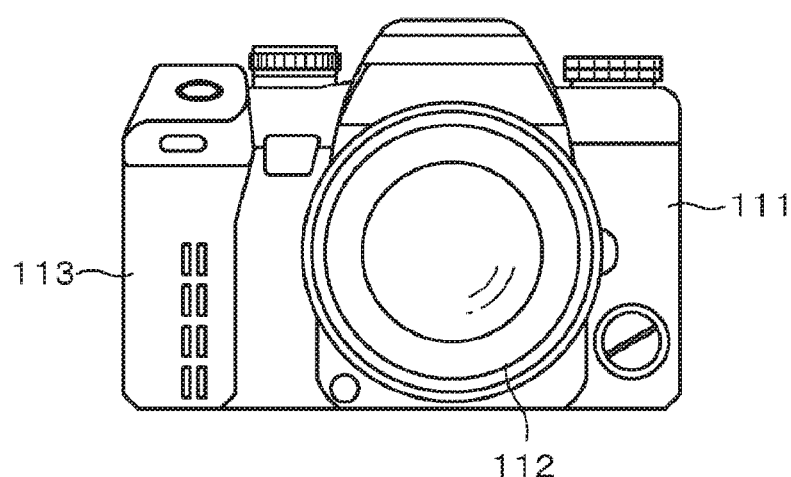
FIG. 15A is a front view of a lens interchangeable single-lens reflex type digital still camera.
Figure 15B:
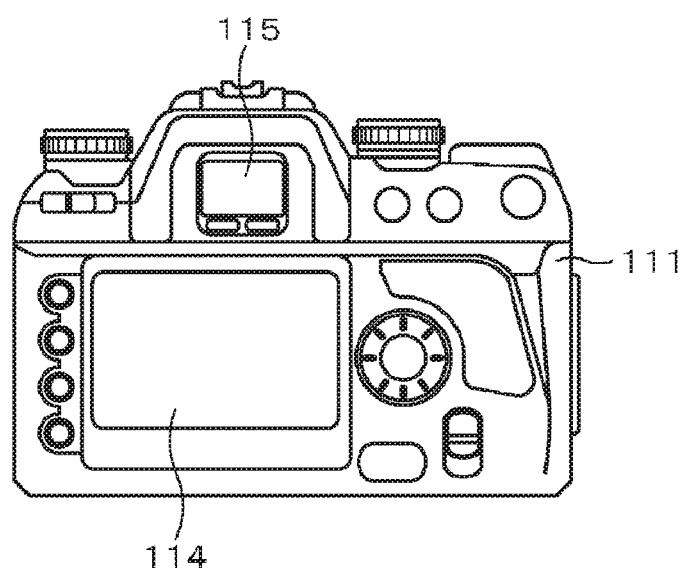
FIG. 15B is a rear view thereof.

FIG. 15 is an external view of a lens interchangeable single-lens reflex type digital still camera, a front view thereof is illustrated in FIG. 15A, and a rear view thereof is illustrated in FIG. 15B. The lens interchangeable single-lens reflex type digital still camera, for example, includes an interchangeable photographing lens unit (an interchangeable lens) 112 on a front right side of a camera main body portion (a camera body) 111, and a grip portion 113 on which a photographer grips, on a front left side.

Then, a monitor 114 is disposed approximately in the rear center of the camera main body portion 111. An electronic viewfinder (an eyepiece window) 115 is disposed on the monitor 114. The photographer looks into the electronic viewfinder 115, and thus, is capable of determining a structural outline by visually recognizing an optical image of a subject guided from the photographing lens unit 112.

In the lens interchangeable single-lens reflex type digital still camera having the configuration described above, the display device of the present disclosure can be used as the electronic viewfinder 115. That is, the lens interchangeable single-lens reflex type digital still camera according to this example, is manufactured by using the display device of the present disclosure as the electronic viewfinder 115.

Specific Example 2

Figure 16:
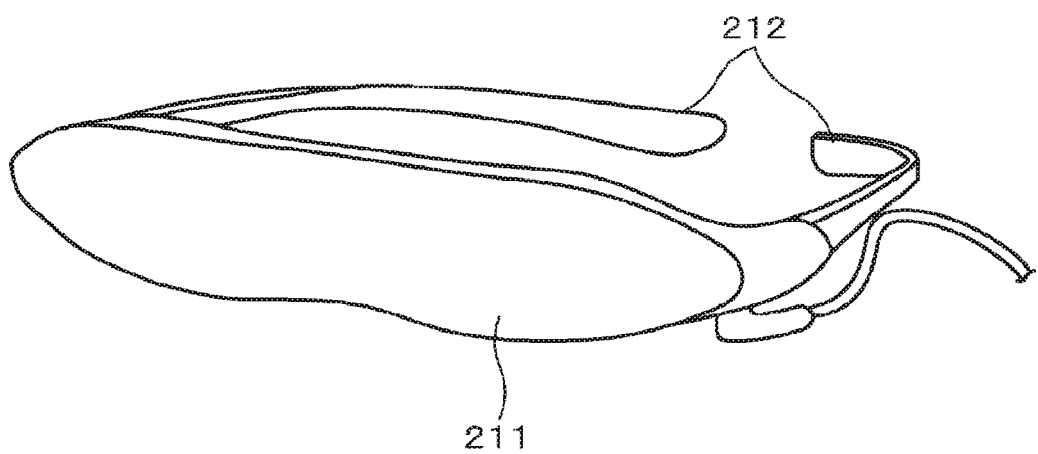
FIG. 16 is an external view of a head-mount type display.

FIG. 16 is an external view of a head-mount type display. The head-mount type display, for example, includes an ear hook portion 212 for being mounted on a head portion of a user, on both sides of a spectacle-shaped display unit 211. In the head-mount type display, the display device of the present disclosure can be used as the display unit 211. That is, the head-mount type display according to this example, is manufactured by using the display device of the present disclosure as the display unit 211.

<Configuration Capable of being Taken by Present Disclosure>

Furthermore, the present disclosure is capable of having the following configurations.

[1] A display device, including:
a circuit unit including a semiconductor substrate and a capacitive element,
in which the capacitative element includes,
a dielectric layer which is formed in the semiconductor substrate, and extends in a substrate depth direction,
a first electrode formed on one surface side of the dielectric layer to face the dielectric layer, and
a second electrode formed on the other surface side of the dielectric layer to face the dielectric layer.

[2] The display device according to [1],
in which the circuit unit is a driving circuit unit which is disposed in each pixel including a light emitting unit, and is configured to drive the light emitting unit.

[3] The display device according to [2],
in which the driving circuit unit includes a driving transistor configured to drive the light emitting unit,
the dielectric layer and the first electrode are formed in an element separation region separating the pixels from each other, in the semiconductor substrate, and
the first electrode is electrically connected to one source/drain region of the driving transistor.

[4] The display device according to [2],
in which the dielectric layer and the first electrode are formed such that lower end portions of the dielectric layer and the first electrode are in a position deeper than a lower end of the element separation region, in the substrate depth direction.

[5] The display device according to [3] or [4],
in which the second electrode is formed on the one source/drain region side in the semiconductor substrate.

[6] The display device according to any of [3] to [5],
in which the second electrode is electrically connected to a power line.

[7] A manufacturing method of a display device provided with a circuit unit including a semiconductor substrate and a capacitative element, in which the capacitative element is manufactured by executing processing of each step of:

forming a dielectric layer extending in a substrate depth direction, in the semiconductor substrate;

forming a first electrode on one surface side of the dielectric layer to face the dielectric layer; and then forming a second electrode on the other surface side of the dielectric layer to face the dielectric layer.

[8] An electronic device including a display device provided with a circuit unit including a semiconductor substrate and a capacitative element, in which the capacitative element includes, a dielectric layer which is formed in the semiconductor substrate, and extends in a substrate depth direction, a first electrode formed on one surface side of the dielectric layer to face the dielectric layer, and a second electrode formed on the other surface side of the dielectric layer to face the dielectric layer.

REFERENCE SIGNS LIST

10 Organic EL display device
20 Pixel (pixel circuit)
21 Organic EL element
22 Driving transistor
23 Writing transistor
24 Light emitting control transistor
25 Switching transistor
26 Retentive capacitance
27 Auxiliary capacitance
30 Pixel array portion
31 ($31_1$ to $31_m$) Scanning line
32 ($32_1$ to $32_m$) First driving line
33 ($33_1$ to $33_m$) Second driving line
34 ($34_1$ to $34_n$) Signal line
35 Common power line
40 Writing scanning unit
50A First driving scanning unit
50B Second driving scanning unit
60 Signal output unit
70 Display panel
71 Semiconductor substrate
211 Anode electrode
212 Organic material layer
213 Cathode electrode
271 Dielectric layer (insulating film)
272 First electrode (electrical conductor)
273 Second electrode (diffusion layer region)

The invention claimed is:

1. A display device comprising an organic EL element and a driving circuit configured to drive the organic EL element, wherein the driving circuit includes:

a driving transistor,
a writing transistor,
a light emitting control transistor,
a switching transistor,
a first capacitor, and
a second capacitor,
wherein the first capacitor and the second capacitor are connected between a power electrical voltage line and a gate electrode of the driving transistor,
wherein in a cross-section view, an electrode of the first capacitor is formed above the gate electrode of the driving transistor, and
in the cross-section view, an electrode of the second capacitor is formed below the gate electrode of the driving transistor.

2. The display device according to claim 1, wherein the electrode of the first capacitor is formed on a first insulating layer that covers the gate electrode of the driving transistor and a gate electrode of the writing transistor.

3. The display device according to claim 2, wherein the electrode of the first capacitor overlaps the gate electrode of the driving transistor.

4. The display device according to claim 2, further comprising a second insulating layer formed over the first capacitor.

5. The display device according to claim 4, wherein the second insulating layer is formed over another electrode of the first capacitor.

6. The display device according to claim 2, further comprising:

a signal output configured to output a signal electrical voltage to the driving circuit through a signal line, and
a writing scanning circuit configured to output a writing scanning signal to the driving circuit through a scanning line.

7. The display device according to claim 6, further comprising a second insulating layer formed over the first capacitor.

8. The display device according to claim 7, wherein the signal line is formed above the second insulating layer.

9. The display device according to claim 8, further comprising:

a third insulating layer formed over the signal line, wherein the organic EL element is formed above the third insulating layer.

10. The display device according to claim 7, wherein the scanning line is formed above the second insulating layer.

11. The display device according to claim 1, wherein the electrode of the second capacitor is formed below a source/drain region of the driving transistor.

12. The display device according to claim 1, wherein another electrode of the first capacitor is formed above the gate electrode of the driving transistor, and another electrode of the second capacitor is formed below the gate electrode of the driving transistor.

* * * * *